(12) United States Patent
Miyake

(10) Patent No.: US 9,935,622 B2
(45) Date of Patent: Apr. 3, 2018

(54) COMPARATOR AND SEMICONDUCTOR DEVICE INCLUDING COMPARATOR

(75) Inventor: Hiroyuki Miyake, Atsugi (JP)

(73) Assignee: SEMICONDUCTOR ENERGY LABORATORY CO., LTD., Kanagawa-ken (JP)

(*) Notice: Subject to any disclaimer, the term of this patent is extended or adjusted under 35 U.S.C. 154(b) by 0 days.

(21) Appl. No.: 13/451,593

(22) Filed: Apr. 20, 2012

(65) Prior Publication Data
US 2012/0274361 A1 Nov. 1, 2012

(30) Foreign Application Priority Data

Apr. 28, 2011 (JP) ................... 2011-100957

(51) Int. Cl.
*H03K 5/153* (2006.01)
*H03K 5/24* (2006.01)

(52) U.S. Cl.
CPC ........... *H03K 5/2472* (2013.01); *H03K 5/249* (2013.01)

(58) Field of Classification Search
CPC ........ H03K 5/2481; H03K 5/249; H03K 5/08; H03K 5/24; G01R 19/16519
USPC ............................ 327/63, 77, 79, 91, 93, 124
See application file for complete search history.

(56) References Cited

U.S. PATENT DOCUMENTS

| 5,153,454 | A | * | 10/1992 | Kohdaka | .................. 327/69 |
| 5,329,172 | A | * | 7/1994 | Kohdaka | .................. 327/63 |
| 5,731,856 | A | | 3/1998 | Kim et al. | |
| 5,744,864 | A | | 4/1998 | Cillessen et al. | |
| 5,811,992 | A | * | 9/1998 | D'Souza | .................. 326/98 |
| 6,147,667 | A | | 11/2000 | Yamazaki et al. | |
| 6,191,442 | B1 | | 2/2001 | Matsufusa | |
| 6,271,691 | B1 | | 8/2001 | Toyoda et al. | |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Quan Tra
(74) *Attorney, Agent, or Firm* — Robinson Intellectual Property Law Office; Eric J. Robinson

(57) ABSTRACT

A chopper comparator with a novel structure is provided. The comparator includes an inverter, a capacitor, a first switch, a second switch, and a third switch. An input terminal and an output terminal of the inverter are electrically connected to each other through the first switch. The input terminal of the inverter is electrically connected to one of a pair of electrodes of the capacitor. A reference potential is applied to the other of the pair of electrodes of the capacitor through the second switch. A signal potential input is applied to the other of the pair of electrodes of the capacitor through the third switch. A potential output from the output terminal of the inverter is an output signal. A transistor whose channel is formed in an oxide semiconductor layer is used as the first switch.

23 Claims, 14 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,690,213 B2 | 2/2004 | Koizumi |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,142,030 B2 | 11/2006 | Osame et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,439,780 B2 | 10/2008 | Sugai |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,554,514 B2 | 6/2009 | Nozawa |
| 7,646,367 B2 | 1/2010 | Kimura |
| 7,674,650 B2 | 3/2010 | Akimoto et al. |
| 7,675,796 B2 | 3/2010 | Kurokawa |
| 7,732,819 B2 | 6/2010 | Akimoto et al. |
| 8,059,109 B2 | 11/2011 | Yamazaki et al. |
| 8,154,541 B2 | 4/2012 | Koyama et al. |
| 8,159,449 B2 | 4/2012 | Kimura et al. |
| 8,421,067 B2 | 4/2013 | Yamazaki et al. |
| 8,742,422 B2 | 6/2014 | Sakakura et al. |
| 9,601,516 B2 | 3/2017 | Sakakura et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0205880 A1 | 9/2005 | Anzai et al. |
| 2005/0225683 A1 | 10/2005 | Nozawa |
| 2005/0259494 A1 | 11/2005 | Kimura et al. |
| 2006/0007212 A1 | 1/2006 | Kimura et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0262066 A1 | 11/2006 | Yamazaki et al. |
| 2006/0284171 A1 | 12/2006 | Levy et al. |
| 2006/0284172 A1 | 12/2006 | Ishii |
| 2006/0284800 A1 | 12/2006 | Kimura et al. |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0084403 A1 | 4/2008 | Kimura et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0078970 A1* | 3/2009 | Yamazaki et al. ............ 257/255 |
| 2009/0114910 A1 | 5/2009 | Chang |
| 2009/0134399 A1 | 5/2009 | Sakakura et al. |
| 2009/0142888 A1* | 6/2009 | Tsuchiya ..................... 438/151 |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0289932 A1 | 11/2009 | Nishi |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0144088 A1* | 6/2010 | Oh et al. ..................... 438/104 |
| 2010/0176395 A1* | 7/2010 | Choi et al. ..................... 257/43 |
| 2011/0090204 A1 | 4/2011 | Yamazaki et al. |
| 2011/0133706 A1 | 6/2011 | Takahashi et al. |
| 2011/0157216 A1 | 6/2011 | Yamazaki et al. |
| 2011/0157253 A1 | 6/2011 | Yamazaki et al. |
| 2011/0157254 A1 | 6/2011 | Yamazaki et al. |
| 2011/0168993 A1* | 7/2011 | Jeon et al. ..................... 257/43 |
| 2011/0199351 A1 | 8/2011 | Kurokawa |
| 2011/0249038 A1 | 10/2011 | Yamazaki et al. |
| 2011/0254523 A1 | 10/2011 | Ito et al. |
| 2011/0285372 A1 | 11/2011 | Takahashi et al. |
| 2011/0285426 A1 | 11/2011 | Takahashi et al. |
| 2017/0186774 A1 | 6/2017 | Sakakura et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-181221 A | 7/1989 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-016079 A | 1/2001 |
| JP | 2002-076356 A | 3/2002 |
| JP | 2002-289859 A | 10/2002 |
| JP | 2003-023342 | 1/2003 |
| JP | 2003-086000 A | 3/2003 |
| JP | 2003-086808 A | 3/2003 |
| JP | 2004-103957 A | 4/2004 |
| JP | 2004-273614 A | 9/2004 |

(56) References Cited

FOREIGN PATENT DOCUMENTS

| JP | 2004-273732 A | 9/2004 |
|---|---|---|
| JP | 2007-157934 A | 6/2007 |
| JP | 2007-201437 A | 8/2007 |
| JP | 2011-049550 A | 3/2011 |
| JP | 2011-077513 A | 4/2011 |
| WO | WO-2004/114391 | 12/2004 |
| WO | 2005/027085 | 3/2005 |
| WO | WO-2011/013502 | 2/2011 |
| WO | WO-2011/027676 | 3/2011 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductors,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector with Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display with Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

(56) References Cited

OTHER PUBLICATIONS

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide IFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs with a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined with Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4808.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors with Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 with Sputtered Al2O3 Gate Insulator,", Appl. Phys. Lett. (Applied Physics Letters) , Sep. 1, 2003, vol. 83, No. 9, pp. 1755-1757.

Kamiya et al., "Carrier Transport Properties and Electronic Structures of Amorphous Oxide Semiconductors: the present status," Solid State Physics, Sep. 1, 2009, vol. 44, No. 9, pp. 621-633, Agne Gijutsu Center.

* cited by examiner

COMPARATOR AND SEMICONDUCTOR DEVICE INCLUDING COMPARATOR

BACKGROUND OF THE INVENTION

1. Field of the Invention

The present invention relates to comparators. In particular, the present invention relates to chopper comparators. Further, the present invention relates to semiconductor devices including chopper comparators. Furthermore, the present invention relates to electronic devices including the semiconductor devices.

2. Description of the Related Art

A differential amplifier (also referred to as an operational amplifier) and a chopper comparator (also referred to as a chopper inverter comparator, an inverter chopper comparator, or the like) are widely used as comparators (comparison circuits). In Patent Document 1 (see FIG. 1 of Patent Document 1), a chopper comparator as illustrated in FIG. 9 is used.

In FIG. 9, a chopper comparator includes an inverter 2621, a capacitor 2622, and switches 2624, 2625, and 2626. The switch 2624 is electrically connected in parallel to the inverter 2621. An output terminal of the inverter 2621 is electrically connected to an output terminal (indicated by "OUT" in FIG. 9) of the chopper comparator. An input terminal of the inverter 2621 is electrically connected to one of a pair of electrodes of the capacitor 2622. Here, the input terminal of the inverter 2621 or the one of the pair of electrodes of the capacitor 2622 is referred to as a node M (indicated by "M" in FIG. 9). The other of the pair of electrodes of the capacitor 2622 is electrically connected to an input terminal (indicated by "IN" in FIG. 9) of the chopper comparator through the switch 2626, and is electrically connected to a terminal VR to which a reference potential is applied, through the switch 2625.

In the chopper comparator in FIG. 9, a reference potential $V_{ref}$ is input to the terminal VR when the switch 2626 is turned off and the switches 2625 and 2624 are turned on. Thus, the potential of the node M is set to the threshold voltage (hereinafter also referred to as $V_{thi}$) of the inverter 2621. Here, the threshold voltage of the inverter 2621 corresponds to an input potential (or an output potential) under the condition that the input potential and the output potential of the inverter 2621 are equal. To set the potential of the node M to $V_{thi}$ is also referred to as initialization. Note that initialization operation can also be referred to as operation of holding predetermined voltage (hereinafter also referred to as reference voltage or criterion voltage $V_c$) between the pair of electrodes of the capacitor 2622. Here, the reference voltage $V_c$ is voltage obtained by subtraction of the threshold voltage $V_{thi}$ from the reference potential $V_{ref}$.

After the initialization, a signal potential (hereinafter also referred to as $V_{in}$) is input to the input terminal IN when the switch 2626 is turned on and the switches 2625 and 2624 are turned off. When the signal potential $V_{in}$ is higher than $V_{thi}$ (a high-level potential (hereinafter referred to as $V_{inH}$)), the output potential of the inverter 2621 becomes low, so that a low-level potential (hereinafter referred to as $V_{outL}$) is output from the output terminal OUT. When the signal potential $V_{in}$ is lower than $V_{thi}$ (a low-level potential (hereinafter referred to as $V_{inL}$)), the output potential of the inverter 2621 becomes high, so that a high-level potential (hereinafter referred to as $V_{outH}$) is output from the output terminal OUT.

Operation of outputting a signal corresponding to a signal input from the input terminal IN in this manner is referred to as normal operation.

The chopper comparator operates as described above.

REFERENCE

Patent Document 1: Japanese Published Patent Application No. 2003-023342.

SUMMARY OF THE INVENTION

In a chopper comparator as disclosed in Patent Document 1, off-state current of a transistor forming the switch 2624 becomes a problem. The off-state current (leakage current) flows through the switch 2624 which is selected to be turned off. With the leakage current, electric charge flows out of or flows into the node M. In this manner, as the time passes after initialization, the reference voltage $V_c$ held in the capacitor 2622 is changed. When the reference voltage $V_c$ is greatly changed, it is impossible to convert the signal potential $V_{in}$ input to the input terminal IN into a potential having a corresponding level and to output the potential from the output terminal OUT.

Specifically, when the signal potential $V_{in}$ input to the input terminal IN is $V_{inH}$, if the potential of the node M is decreased by a change in reference voltage $V_c$ after initialization and the amount of decrease is larger than the difference between $V_{inH}$ and the threshold voltage $V_{thi}$, it is impossible to output $V_{outL}$ from the output terminal OUT. Further, when the signal potential $V_{in}$ input to the input terminal IN is $V_{inL}$, if the potential of the node M is increased by a change in reference voltage $V_c$ after initialization and the amount of increase is larger than the difference between the threshold voltage $V_{thi}$ and $V_{inL}$, it is impossible to output $V_{outH}$ from the output terminal OUT. In other words, if the reference voltage $V_c$ is greatly changed by leakage current flowing through the switch 2624 after initialization, the chopper comparator fails, which causes a malfunction.

For example, in the case where the levels of $V_{inH}$ and $V_{inL}$ are set so that a (substantially) intermediate potential between $V_{inH}$ and $V_{inL}$ is $V_{thi}$, if the amount of change in potential of the node M by a change in reference voltage $V_c$ is larger than the half of amplitude voltage (the difference between $V_{inH}$ and $V_{inL}$) of the signal potential $V_{in}$, it is impossible to convert the signal potential $V_{in}$ input to the input terminal IN into a potential having a predetermined level and to output the potential from the output terminal OUT. In other words, the chopper comparator fails, which causes a malfunction.

In order to prevent the malfunction, it is necessary to perform frequent initialization every predetermined period. Note that during initialization, the chopper comparator cannot operate as a comparator (cannot perform normal operation). Thus, the timing of performing normal operation is restricted (this also means that the flexibility of a driving method is low, for example). There is a method in which at least the two comparators are provided so that normal operation can be performed by one of the comparators while initialization is performed by the other comparator. However, with such a method, operation becomes complex and the circuit area increases.

Thus, it is an object to provide a highly reliable chopper comparator with a novel structure. Further, it is an object to provide a highly reliable semiconductor device including such a comparator.

One embodiment of a comparator in the present invention includes an inverter, a capacitor, a first switch, a second switch, and a third switch. A signal potential input is converted into a potential having a corresponding level, and the converted potential is an output signal. An input terminal and an output terminal of the inverter are electrically connected to each other through the first switch. The input terminal of the inverter is electrically connected to one of a pair of electrodes of the capacitor. A reference potential is applied to the other of the pair of electrodes of the capacitor through the second switch. A signal potential is applied to the other of the pair of electrodes of the capacitor through the third switch. A potential output from the output terminal of the inverter is an output signal. Here, a transistor whose off-state current is extremely low is used as the first switch.

One embodiment of a comparator in the present invention includes a clocked inverter, a capacitor, a first switch, a second switch, and a third switch. A signal potential input is converted into a potential having a corresponding level, and the converted potential is an output signal. The clocked inverter inverts a signal input to an input terminal and outputs the inverted signal from an output terminal, in synchronization with a clock signal. The input terminal and the output terminal of the clocked inverter are electrically connected to each other through the first switch. The input terminal of the clocked inverter is electrically connected to one of a pair of electrodes of the capacitor. A reference potential is applied to the other of the pair of electrodes of the capacitor through the second switch. A signal potential is applied to the other of the pair of electrodes of the capacitor through the third switch. A potential output from the output terminal of the clocked inverter is used as an output signal. Here, a transistor whose off-state current is extremely low is used as the first switch.

Here, off-state current of an n-channel transistor is current which flows between a source and a drain when a potential of the drain is higher than that of the source while the potential of a gate is 0 V or lower in the case of the potential of the source used as a reference. Off-state current of a p-channel transistor is current which flows between a source and a drain when a potential of the drain is lower than that of the source while the potential of a gate is 0 V or higher in the case of the potential of the source used as a reference.

A plurality of transistors electrically connected in parallel to each other are used as the first switch, and the plurality of transistors may have extremely low off-state current. Further, the plurality of transistors may be provided to overlap with each other. The channel widths of the plurality of transistors can be (substantially) equal to each other. The channel lengths of the plurality of transistors can be (substantially) equal to each other.

A plurality of transistors electrically connected in series with each other are used as the first switch, and the plurality of transistors may have extremely low off-state current. Further, the plurality of transistors may be provided to overlap with each other. The channel lengths of the plurality of transistors can be (substantially) equal to each other. The channel widths of the plurality of transistors can be (substantially) equal to each other. Note that the plurality of transistors electrically connected in series with each other can also be referred to as a multi-gate transistor.

A plurality of multi-gate transistors electrically connected in parallel to each other may be used as the first switch, and the plurality of multi-gate transistors may have extremely low off-state current.

Here, as a transistor whose off-state current is extremely low, it is possible to use a transistor whose channel is formed in a layer or substrate including a semiconductor whose bandgap is wider than that of silicon. A compound semiconductor is an example of the semiconductor whose bandgap is wider than that of silicon. Examples of the compound semiconductor include an oxide semiconductor and a nitride semiconductor. A transistor whose channel is formed in an oxide semiconductor layer can be used as the transistor whose off-state current is extremely low, for example.

A transistor whose channel is formed in a silicon layer or a silicon substrate may be used for at least one of the inverter, the second switch, and the third switch, and may be provided to overlap with the transistor forming the first switch.

Since the transistor whose off-state current is extremely low is used as the first switch, current (leakage current) flowing through the first switch which is selected to be turned off can be reduced. Thus, after initialization, a change in voltage held in the capacitor is inhibited, so that the malfunction of the comparator can be reduced. Further, the frequency of initialization can be reduced, so that the flexibility of a driving method is high.

In the case where current flowing through the first switch which is selected to be turned on is increased, that is, the transistor used as the first switch has high on-state current, initialization can be performed at high speed. Here, the on-state current of the transistor can be increased by an increase in channel width of the transistor. However, larger channel width causes a pronounced heat generation problem in the transistor. Thus, a plurality of transistors electrically connected in parallel to each other are used as the first switch. In this manner, heat generation in the plurality of transistors used as the first switch can be inhibited and current flowing through the first switch which is selected to be turned on can be increased. Accordingly, initialization can be performed at higher speed without sacrificing the reliability of the comparator. Further, when the plurality of transistors overlap with each other, current flowing through the first switch which is selected to be turned on can be increased and an increase in area of the first switch can be inhibited. Accordingly, an increase in circuit area can be inhibited and initialization can be performed at higher speed, without sacrificing the reliability of the comparator.

Note that when a plurality of transistors electrically connected in series with each other are used as the first switch, current (leakage current) flowing through the first switch which is selected to be turned off can be further reduced. Thus, the frequency of initialization can be further reduced. Further, when the plurality of transistors overlap with each other, current (leakage current) flowing through the first switch which is selected to be turned off can be further reduced and an increase in area of the first switch can be inhibited. Accordingly, an increase in circuit area can be inhibited and the frequency of initialization can be further reduced.

Note that when a plurality of multi-gate transistors electrically connected in parallel to each other are used as the first switch, heat generation in the plurality of transistors used as the first switch can be inhibited, current flowing through the first switch which is selected to be turned on can be increased, and current (leakage current) flowing through the first switch which is selected to be turned off can be reduced. Accordingly, initialization can be performed at higher speed and the frequency of initialization can be further reduced, without sacrificing the reliability of the comparator. Further, when the plurality of multi-gate transistors overlap with each other, current flowing through the first switch which is selected to be turned on can be increased and an increase in area of the first switch can be inhibited. Accordingly, an increase in circuit area can be inhibited, initialization can be performed at higher speed, and the frequency of initialization can be further reduced, without sacrificing the reliability of the comparator.

In this manner, a highly reliable comparator can be obtained. Further, with the use of the comparator, a highly reliable semiconductor device can be obtained.

DETAILED DESCRIPTION OF THE INVENTION

Figure 1A:
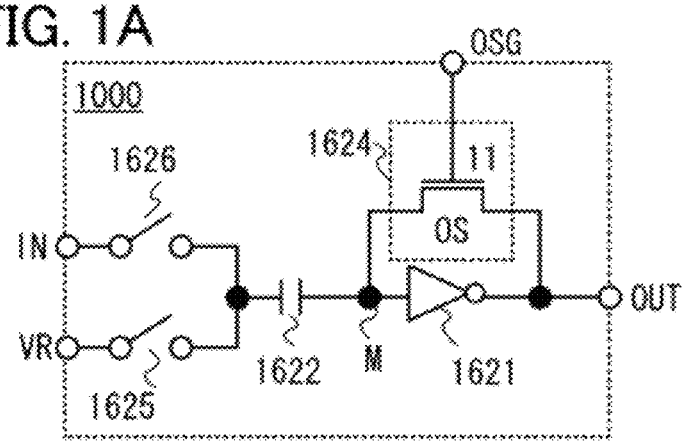
FIGS. 1A and 1B are a circuit diagram and a cross-sectional view illustrating the structure of a chopper comparator.

Embodiments and an example will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments and the example.

Note that the functions of a "source" and a "drain" might interchange when a transistor of opposite polarity is used or the direction of current flow is changed in circuit operation, for example. Thus, in this specification, the terms "source" and "drain" can interchange.

An expression "electrically connected" means that components are connected to each other through an object having any electric action. Here, there is no particular limitation on an object having any electric action as long as electric signals can be transmitted and received between components that are connected to each other. Examples of an object having any electric action include an electrode, a wiring, a switching element such as a transistor, a resistor, an inductor, a capacitor, and an element with a variety of functions.

Even when independent components are electrically connected to each other in a circuit diagram, one conductive film might have functions of a plurality of components, for example, part of a wiring also functions as an electrode. The expression "electrically connected" in this specification also means that one conductive film has functions of a plurality of components.

A term "over" or "below" does not necessarily mean that a component is placed "directly on" or "directly under" another component. For example, an expression "a gate electrode over a gate insulating layer" does not exclude the case where another component is placed between the gate insulating layer and the gate electrode.

The position, size, range, or the like of each component illustrated in drawings and the like is not accurately represented for easy understanding in some cases. Thus, the disclosed invention is not necessarily limited to the position, size, range, or the like disclosed in the drawings and the like.

Ordinal numbers such as "first", "second", and "third" are used in order to avoid confusion among components.

Embodiment 1

One embodiment of a chopper comparator in the present invention is described.

(Structure of Comparator)

FIG. 1A is one embodiment of a circuit diagram of a chopper comparator in the present invention. In FIG. 1A, a chopper comparator 1000 includes a switch 1624, a switch 1625, a switch 1626, an inverter 1621, and a capacitor 1622. The switch 1624 is electrically connected in parallel to the inverter 1621. An output terminal of the inverter 1621 is electrically connected to an output terminal (indicated by "OUT" in FIG. 1A) of the chopper comparator 1000. An input terminal of the inverter 1621 is electrically connected to one of a pair of electrodes of the capacitor 1622. Here, the input terminal of the inverter 1621 or the one of the pair of electrodes of the capacitor 1622 is referred to as a node M (indicated by "M" in FIG. 1A). The other of the pair of electrodes of the capacitor 1622 is electrically connected to an input terminal (indicated by "IN" in FIG. 1A) of the chopper comparator 1000 through the switch 1626, and is electrically connected to a terminal VR to which a reference potential is applied through the switch 1625.

Here, a transistor whose off-state current is extremely low is used as the switch 1624. In FIG. 1A, a transistor 11 is used as the switch 1624. For example, a transistor whose channel is formed in an oxide semiconductor layer can be used as the transistor. In FIG. 1A, "OS" is written beside the transistor 11 in order to indicate that a channel of the transistor 11 is formed in an oxide semiconductor layer. A gate of the transistor 11 is electrically connected to a terminal OSG and is supplied with a control signal. On or off of the transistor 11 is selected by the control signal. That is, on or off of the switch 1624 is selected by the control signal.

Note that instead of the inverter 1621, a clocked inverter for inverting a signal input and outputting the inverted signal, in synchronization with a clock signal, may be used. Transistors can be used for the switch 1625, the switch 1626, and the inverter 1621. The transistors can have given structures. For example, transistors whose channels are formed in silicon layers or silicon substrates can be used for the switch 1625, the switch 1626, and the inverter 1621.

(Method for Driving Comparator)

A method for driving the chopper comparator 1000 in FIG. 1A is described. A reference potential $V_{ref}$ is input to the terminal VR when the switch 1626 is turned off (also referred to as in an off state or in a nonconductive state) and the switches 1625 and 1624 are turned on (also referred to as in an on state or in a conductive state). Thus, the potential of the node M is set to the threshold voltage (also referred to as $V_{thi}$) of the inverter 1621. Here, the threshold voltage of the inverter 1621 corresponds to an input potential (or an output potential) under the condition that the input potential and the output potential of the inverter 1621 are equal. To set the potential of the node M to $V_{thi}$ is also referred to as initialization. Note that initialization can also be referred to as operation of holding predetermined voltage (hereinafter also referred to as reference voltage $V_c$) between the pair of electrodes of the capacitor 1622. Here, the reference voltage $V_c$ is voltage obtained by subtraction of the threshold voltage $V_{thi}$ from the reference potential $V_{ref}$.

After the initialization, a signal potential (hereinafter referred to as $V_{in}$) is input to an input terminal IN when the switch 1626 is turned on and the switches 1625 and 1624 are turned off. When the signal potential $V_{in}$ is higher than $V_{thi}$ (a high-level potential (hereinafter referred to as $V_{inH}$)), the output potential of the inverter 1621 becomes low, so that a low-level potential (hereinafter referred to as $V_{outL}$) is output from an output terminal OUT. When the signal potential $V_{in}$ is lower than $V_{thi}$ (a low-level potential (hereinafter referred to as $V_{inL}$)), the output potential of the inverter 1621 becomes high, so that a high-level potential (hereinafter referred to as $V_{outH}$) is output from the output terminal OUT. Operation of outputting a signal corresponding to a signal input from the input terminal IN in this manner is referred to as normal operation.

The chopper comparator 1000 operates as described above.

Since the transistor 11 whose off-state current is extremely low is used as the switch 1624, current (leakage current) flowing through the switch 1624 which is selected to be turned off can be reduced. Thus, after initialization, a change in reference voltage $V_c$ held in the capacitor 1622 is inhibited, so that the malfunction of the comparator 1000 can be reduced. Further, in the comparator 1000, the frequency of initialization can be reduced, so that the flexibility of a driving method can be high.

(Cross-Sectional Structure of Comparator)

Figure 1B:
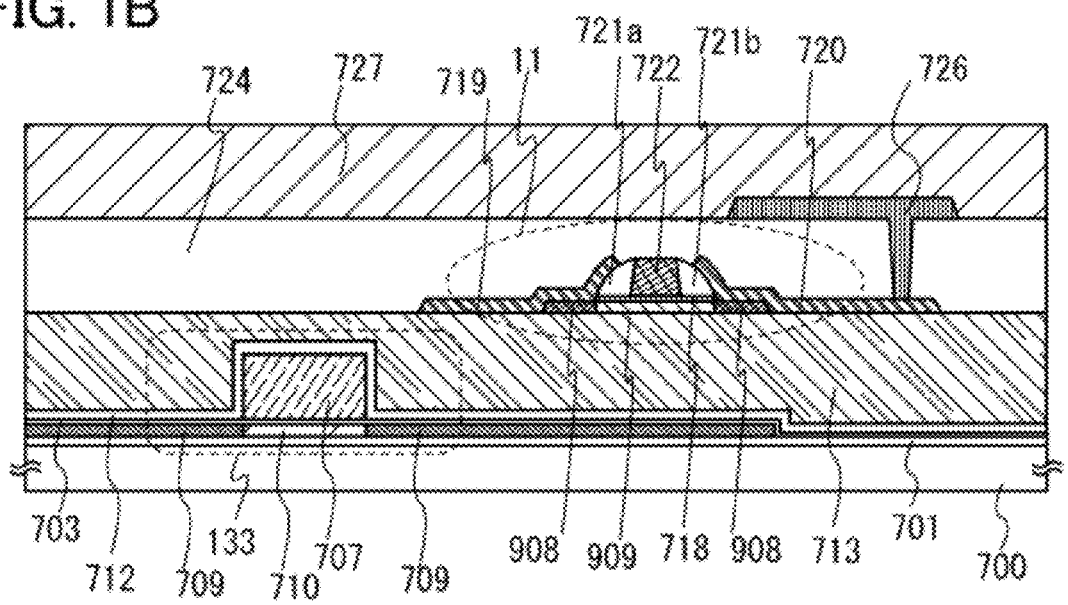

A more specific structure example of the comparator 1000 in FIG. 1A is described. FIG. 1B is a cross-sectional view illustrating the structure of the comparator 1000 in FIG. 1A. FIG. 1B illustrates the transistor 11 forming the switch 1624 and a transistor 133 included in the inverter 1621, as typical examples.

An insulating film 701 is formed over a substrate 700, and the transistor 133 is formed over the insulating film 701. The transistor 133 includes a semiconductor layer having a channel formation region 710 and impurity regions 709, an insulating film 703 functioning as a gate insulating film, and a gate electrode 707. The semiconductor layer can be a silicon layer, for example. Note that a transistor whose channel is formed in a single crystal semiconductor substrate may be used as the transistor 133. A silicon substrate can be used as the single crystal semiconductor substrate, for example. Insulating films 712 and 713 are formed over the transistor 133, and the transistor 11 is formed thereover. The transistor 11 includes an oxide semiconductor layer having a region 909 including a channel formation region and high-concentration regions 908, an insulating layer 718 functioning as a gate insulating film, a gate electrode 722, insulators 721a and 721b functioning as side walls, and conductive layers 719 and 720 functioning as a source and drain electrodes. An insulating film 724 is formed over the transistor 11. A wiring 726 is formed over the insulating film 724. An insulating film 727 is formed over the wiring 726.

As illustrated in FIG. 1B, the transistor 11 forming the switch 1624 can overlap with another transistor included in the comparator 1000. For example, the transistor 11 can overlap with the transistor 133 included in the inverter 1621. In this manner, in the comparator 1000, an increase in circuit area can be inhibited and the frequency of initialization can be reduced, so that the flexibility of a driving method can be high.

This embodiment can be combined with any of the other embodiments as appropriate.

Embodiment 2

Figure 2A:
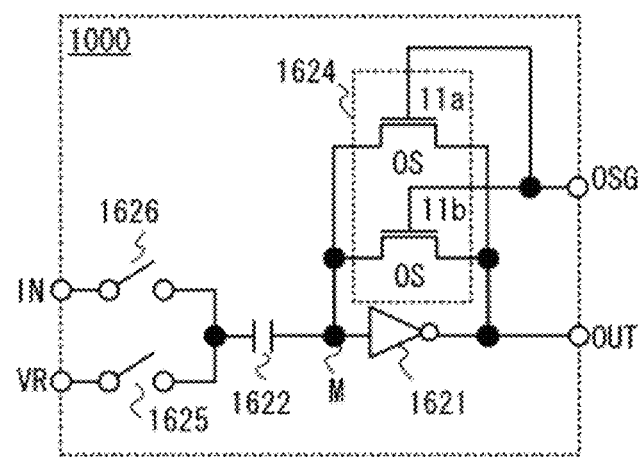
FIGS. 2A and 2B are a circuit diagram and a cross-sectional view illustrating the structure of a chopper comparator.

Another embodiment of a chopper comparator in the present invention is described. FIG. 2A is one embodiment of a circuit diagram of a chopper comparator in the present invention.

The chopper comparator 1000 in FIG. 2A differs from the chopper comparator 1000 in FIG. 1A in that transistors 11a and 11b electrically connected in parallel to each other are used as the switch 1624, and other structures are similar to those in FIG. 1A; thus, a description thereof is omitted. Note that the switch 1624 is not limited to being constituted of two transistors. A plurality of transistors electrically connected in parallel to each other can be used as the switch 1624. Thus, the value of current flowing through the switch 1624 can be increased, so that initialization can be efficiently performed. Further, heat generation in the transistors can be inhibited.

A method for driving the comparator 1000 in FIG. 2A is similar to the method for driving the comparator 1000 in FIG. 1A; thus, a description thereof is omitted.

(Cross-Sectional Structure of Comparator)

Figure 2B:
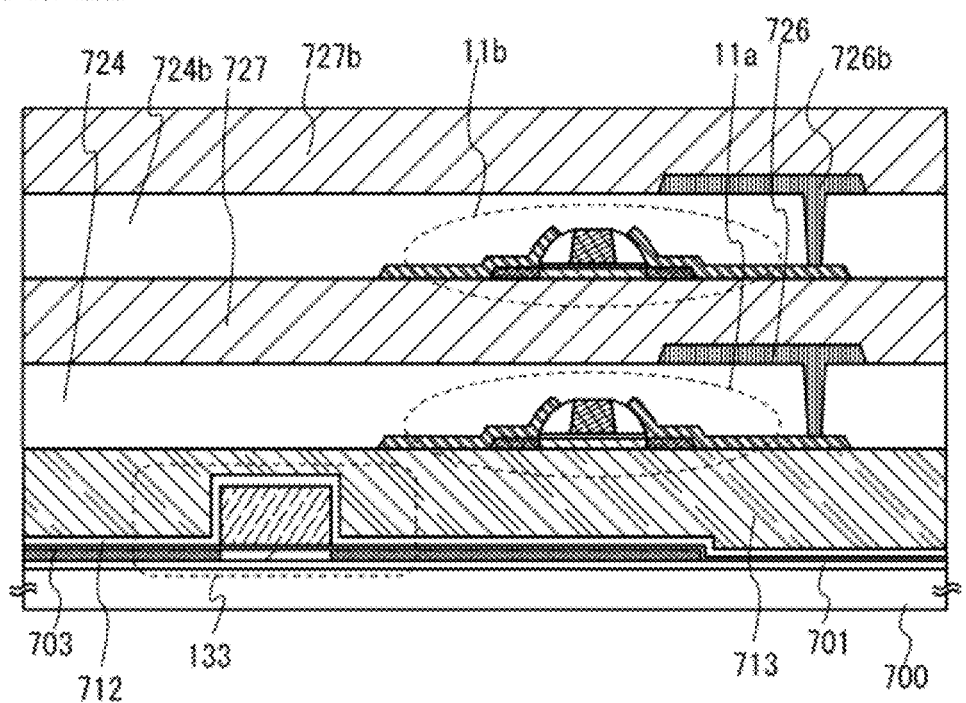

A more specific structure example of the comparator 1000 in FIG. 2A is described. FIG. 2B is a cross-sectional view illustrating the structure of the comparator 1000 in FIG. 2A. FIG. 2B illustrates the transistors 11a and 11b forming the switch 1624 and the transistor 133 included in the inverter 1621, as typical examples. The transistors 11a and 11b can each have a structure which is similar to the structure of the transistor 11 in FIG. 1B. Note that a description of portions which are the same as those in FIG. 1B is omitted. An insulating film 724b is formed over the transistor 11b. A wiring 726b is formed over the insulating film 724b. An insulating film 727b is formed over the wiring 726b.

As illustrated in FIG. 2B, the transistors 11a and 11b forming the switch 1624 can overlap with another transistor included in the comparator 1000. For example, the transistors 11a and 11b can overlap with the transistor 133 included in the inverter 1621. Further, the transistors 11a and 11b can overlap with each other. In this manner, in the comparator 1000, an increase in circuit area can be inhibited, initialization can be efficiently performed, and the frequency of initialization can be reduced, so that the flexibility of a driving method can be high.

This embodiment can be combined with any of the other embodiments as appropriate.

Embodiment 3

Figure 3A:
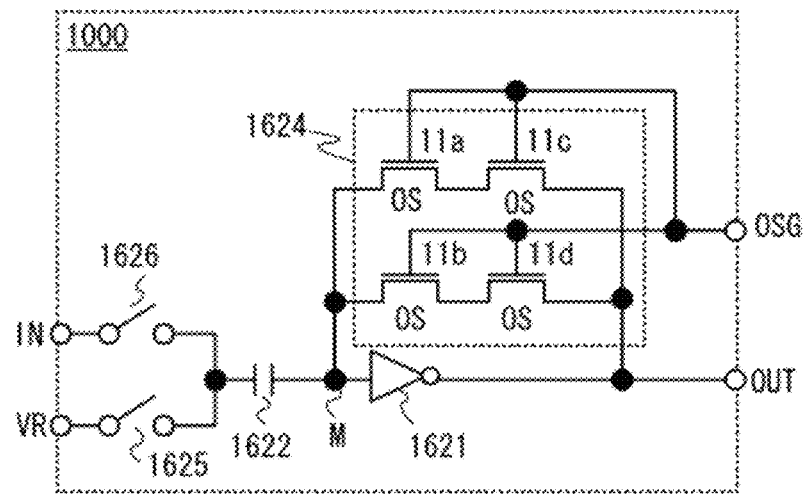
FIGS. 3A and 3B are a circuit diagram and a cross-sectional view illustrating the structure of a chopper comparator.

Another embodiment of a chopper comparator in the present invention is described. FIG. 3A is one embodiment of a circuit diagram of a chopper comparator in the present invention.

The chopper comparator 1000 in FIG. 3A differs from the chopper comparator 1000 in FIG. 1A in that the transistor 11a and a transistor 11c electrically connected in series with each other, the transistor 11b and a transistor 11d electrically connected in series with each other, and a circuit constituted of the transistors 11a and 11c and a circuit constituted of the transistors 11b and 11d which are electrically connected in parallel to each other are used as the switch 1624. Other structures are similar to those in FIG. 1A; thus, a description thereof is omitted. Note that the switch 1624 is not limited to being constituted of four transistors. A plurality of transistors electrically connected in series and in parallel to each other can be used as the switch 1624. This structure can also be referred to as a structure in which multi-gate transistors are electrically connected in parallel to each other. Thus, the value of current flowing through the switch 1624 can be increased, so that initialization can be efficiently performed. Further, heat generation in the transistors can be inhibited. Further, current (leakage current) flowing through the switch 1624 can be further reduced, so that the frequency of initialization can be further reduced.

Note that the switch 1624 is not limited to being constituted of four transistors. A plurality of transistors electrically connected in series with each other can be used as the switch 1624. This structure can also be thought of as a structure in which multi-gate transistors are used. Thus, current (leakage current) flowing through the switch 1624 can be further reduced, so that the frequency of initialization can be further reduced.

A method for driving the comparator 1000 in FIG. 3A is similar to the method for driving the comparator 1000 in FIG. 1A; thus, a description thereof is omitted.

(Cross-Sectional Structure of Comparator)

Figure 3B:
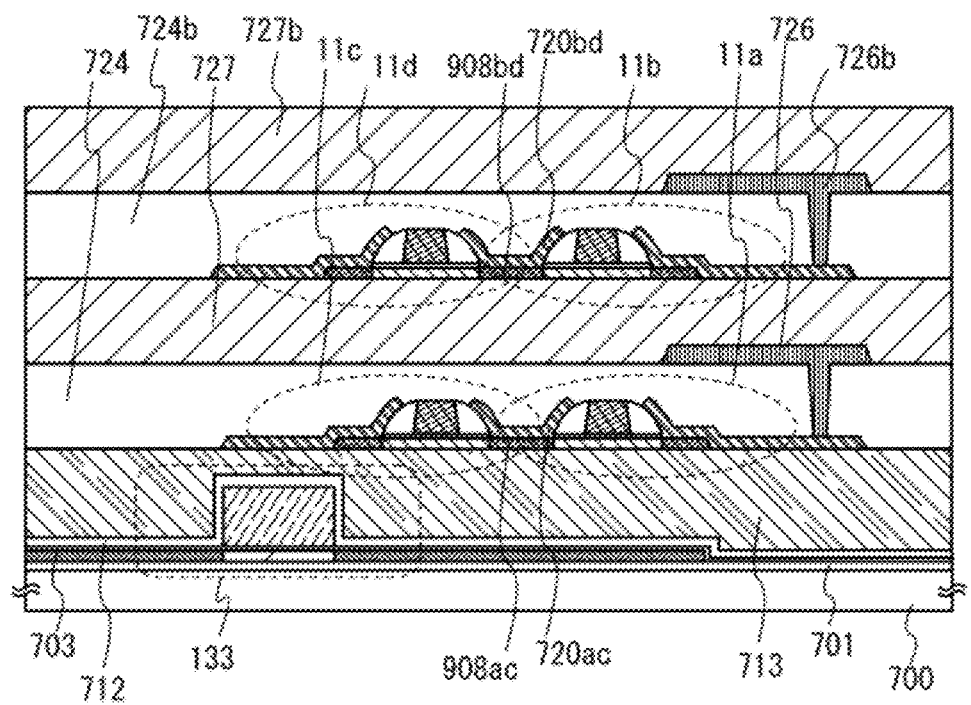

A more specific structure example of the comparator 1000 in FIG. 3A is described. FIG. 3B is a cross-sectional view illustrating the structure of the comparator 1000 in FIG. 3A. FIG. 3B illustrates the transistors 11a, 11b, 11c, and 11d forming the switch 1624 and the transistor 133 included in the inverter 1621, as typical examples. The transistors 11a, 11b, 11c, and 11d can each have a structure which is similar to the structure of the transistor 11 in FIG. 1B. Note that a description of portions which are the same as those in FIG. 2B is omitted. Here, the transistors 11a and 11c share a high-concentration region 908ac. In addition, the transistors 11a and 11c share a conductive layer 720ac. With this structure, the area of the transistors 11a and 11c can be decreased. The transistors 11 and 11d share a high-concentration region 908bd. Further, the transistors 11b and 11d share a conductive layer 720bd. With this structure, the area of the transistors 11b and 11d can be decreased.

As illustrated in FIG. 3B, the transistors 11a, 11b, 11c, and 11d forming the switch 1624 can overlap with another transistor included in the comparator 1000. For example, the transistors 11a, 11b, 11c, and 11d can overlap with the transistor 133 included in the inverter 1621. Further, the transistors 11a, 11b, 11c, and 11d can overlap with each other. In this manner, in the comparator 1000, an increase in circuit area can be inhibited, initialization can be efficiently performed, and the frequency of initialization can be further reduced, so that the flexibility of a driving method can be high.

This embodiment can be combined with any of the other embodiments as appropriate.

Embodiment 4

A method for forming a comparator is described. In this embodiment, a method for forming the comparator 1000 is described giving the transistor 11 whose channel is formed in an oxide semiconductor layer, the capacitor 1622, and the transistor 133 included in the inverter 1621 in the comparator 1000 in FIG. 1A as examples. In the case where the inverter 1621 includes a complimentary transistor, another transistor whose polarity is different from the polarity of the transistor 133 is provided. Here, the transistor 133 is a transistor whose channel is formed in a silicon layer.

Note that another transistor included in the comparator 1000 (e.g., a transistor used as the switch 1626 or a transistor used as the switch 1625) can be formed in a manner similar to that of the transistor 133.

Figure 4A:
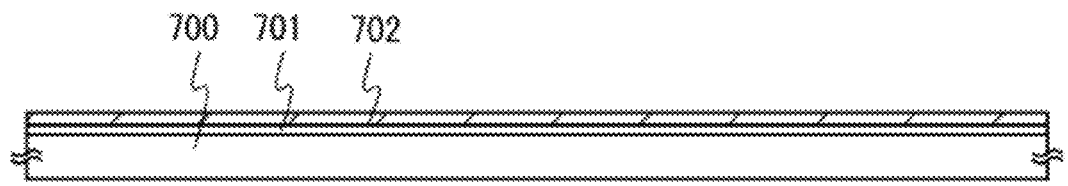
FIGS. 4A to 4D illustrate steps of forming a comparator.

First, as illustrated in FIG. 4A, the insulating film 701 and a semiconductor film 702 which is separated from a single crystal semiconductor substrate are formed over the substrate 700.

Although there is no particular limitation on a material which can be used as the substrate 700, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 700. In the case where the temperature of the heat treatment to be performed later is high, a glass substrate whose strain point is 730° C. or higher is preferably used as a glass substrate.

In this embodiment, a method for forming the transistor 133 is described below giving the semiconductor film 702 formed using single crystal silicon as an example. Note that a specific example of a method for forming the single crystal semiconductor film 702 is briefly described. First, an ion beam including ions which are accelerated by an electric field enters a bond substrate which is the single crystal semiconductor substrate and a fragile layer which is fragile because of local disorder of the crystal structure is formed in a region at a certain depth from a surface of the bond substrate. The depth at which the fragile layer is formed can be adjusted by the acceleration energy of the ion beam and the angle at which the ion beam enters. Then, the bond substrate and the substrate 700 which is provided with the insulating film 701 are attached to each other so that the insulating film 701 is sandwiched therebetween. After the bond substrate and the substrate 700 overlap with each other, a pressure of approximately 1 to 500 N/cm$^2$, preferably 11 to 20 N/cm$^2$ is applied to part of the bond substrate and part of the substrate 700 so that the substrates are attached to each other. When the pressure is applied to part of the bond substrate and part of the substrate 700, bonding between the bond substrate and the insulating film 701 starts from the parts, which results in bonding of the entire surface where the bond substrate and the insulating film 701 are in close contact with each other. After that, heat treatment is performed, so that microvoids that exist in the fragile layer are combined, and the volume of the microvoids is increased. Accordingly, a single crystal semiconductor film which is part of the bond substrate is separated from the bond substrate along the fragile layer. The temperature of the heat treatment is set so as not to exceed the strain point of the substrate 700. Then, the single crystal semiconductor film is processed into a desired shape by etching or the like, so that the semiconductor film 702 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element may be added to the semiconductor film which is not etched to have a predetermined shape or the semiconductor film 702 which is etched to have a predetermined shape in order to control the threshold voltage. Alternatively, an impurity element may be added to the bond substrate in order to control the threshold voltage. Alternatively, an impurity element may be added to the bond substrate in order to roughly control the threshold voltage, and an impurity element may also be added to the semiconductor film which is not etched to have a predetermined shape or the semiconductor film 702 which is etched to have a predetermined shape in order to finely control the threshold voltage.

Note that although the single crystal semiconductor film is used in this embodiment, this embodiment is not limited to this structure. For example, a bulk semiconductor substrate that is isolated by shallow trench isolation (STI) or the like may be used. A polycrystalline, microcrystalline, or amorphous semiconductor film which is formed over the insulating film 701 by vapor deposition may be used, for example. Alternatively, the semiconductor film may be crystallized by a known technique. As a known crystallization technique, laser crystallization using a laser beam or crystallization using a catalytic element can be used. Alternatively, crystallization using a catalytic element and laser crystallization can be used in combination. In the case where a heat-resistant substrate such as a quartz substrate is used, any of thermal crystallization using an electrically heated oven, lamp heating crystallization using infrared light, crystallization using a catalytic element, and high-temperature heating at approximately 950° C. may be used in combination.

Figure 4B:

Next, as illustrated in FIG. 4B, a semiconductor layer 704 is formed using the semiconductor film 702. Then, the insulating film 703 functioning as a gate insulating film is formed over the semiconductor layer 704.

The insulating film 703 can be formed using a single layer or a stack of layers of a film including silicon oxide, silicon nitride oxide, silicon oxynitride, silicon nitride, hafnium oxide, aluminum oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like by plasma-enhanced CVD, sputtering, or the like, for example.

Note that in this specification, an oxynitride is a substance which includes more oxygen than nitrogen, and a nitride oxide is a substance which includes more nitrogen than oxygen.

The thickness of the insulating film 703 can be, for example, 1 to 100 nm, preferably 10 to 50 nm. In this embodiment, a single-layer insulating film containing silicon oxide is formed as the insulating film 703 by plasma-enhanced CVD.

Figure 4C:
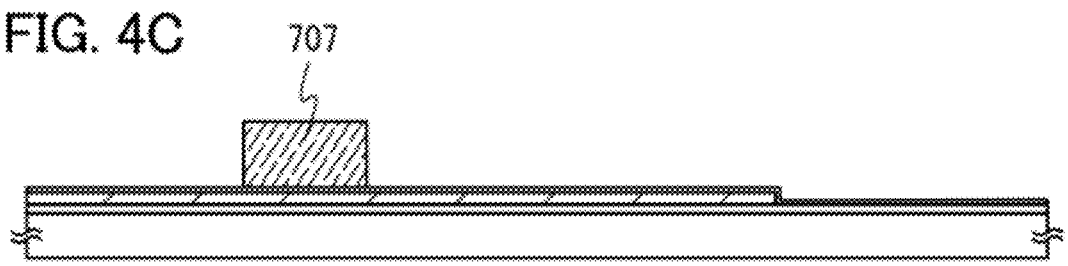

Then, as illustrated in FIG. 4C, the gate electrode 707 is formed.

A conductive film is formed and then is processed into a predetermined shape, so that the gate electrode 707 can be formed. The conductive film can be formed by CVD, sputtering, vapor deposition, spin coating, or the like. For the conductive film, tantalum (Ta), tungsten (W), titanium (Ti), molybdenum (Mo), aluminum (Al), copper (Cu), chromium (Cr), niobium (Nb), or the like can be used. An alloy containing the metal as its main component or a compound containing the metal may be used. Alternatively, the conductive film may be formed using a semiconductor such as polycrystalline silicon doped with an impurity element imparting conductivity, such as phosphorus, to the semiconductor film.

Note that although the gate electrode 707 is formed using a single-layer conductive film in this embodiment, this embodiment is not limited to this structure. The gate electrode 707 may be formed using a plurality of stacked conductive films.

As a combination of two conductive films, tantalum nitride or tantalum can be used for a first conductive film and tungsten can be used for a second conductive film. As well as the example, any of the following combinations can be used as the combination of two conductive films: tungsten nitride and tungsten; molybdenum nitride and molybdenum; aluminum and tantalum; aluminum and titanium; and the like. Since tungsten and tantalum nitride have high heat resistance, heat treatment for thermal activation can be performed in a step performed after the two conductive films are formed. Alternatively, as the combination of the two conductive films, for example, nickel silicide and silicon doped with an impurity element imparting n-type conductivity, tungsten silicide and silicon doped with an impurity element imparting n-type conductivity, or the like can be used.

In the case of a three-layer structure in which three conductive films are stacked, a layered structure of a molybdenum film, an aluminum film, and a molybdenum film is preferably used.

A light-transmitting oxide conductive film of indium oxide, indium oxide-tin oxide, indium oxide-zinc oxide, zinc oxide, zinc aluminum oxide, zinc aluminum oxynitride, zinc gallium oxide, or the like can be used as the gate electrode 707.

Alternatively, the gate electrode 707 may be selectively formed by a droplet discharge method without the use of a mask. A droplet discharge method is a method for forming a predetermined pattern by discharge or ejection of a droplet containing a predetermined composition from an orifice, and includes an inkjet method in its category.

In addition, the gate electrode 707 can be formed in such a manner that a conductive film is formed and then is etched by inductively coupled plasma (ICP) etching under appropriately controlled conditions (e.g., the amount of electric power applied to a coiled electrode layer, the amount of electric power applied to an electrode layer on the substrate side, and the electrode temperature on the substrate side) to have a desired tapered shape. Further, an angle and the like of the tapered shape may be controlled by the shape of a mask. Note that for an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 4D:
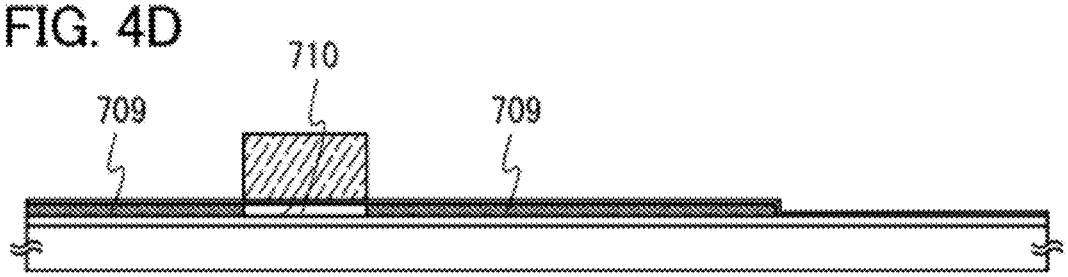

Next, as illustrated in FIG. 4D, when an impurity element imparting one conductivity is added to the semiconductor layer 704 with the gate electrode 707 used as a mask, the channel formation region 710 overlapping with the gate electrode 707 and the pair of impurity regions 709 sandwiching the channel formation region 710 are formed in the semiconductor layer 704.

In this embodiment, an impurity element imparting p-type conductivity (e.g., boron) is added to the semiconductor layer 704.

Figure 5A:
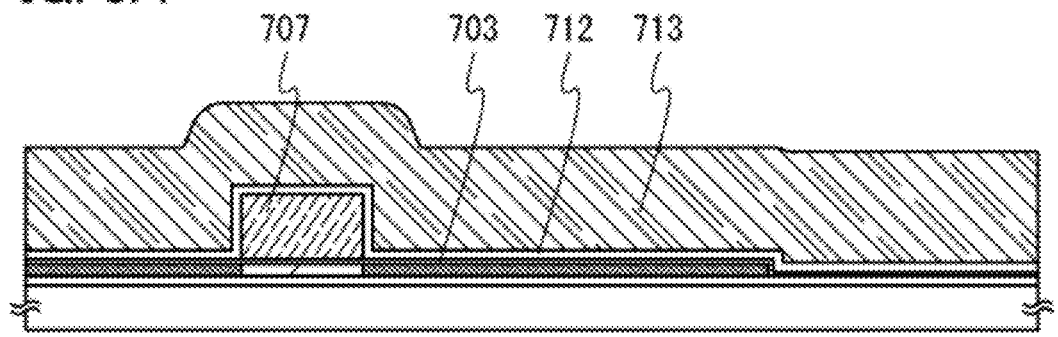
FIGS. 5A to 5D illustrate steps of forming the comparator.

Next, as illustrated in FIG. 5A, the insulating films 712 and 713 are formed to cover the gate insulating film 703 and the gate electrode 707. Specifically, inorganic insulating films of silicon oxide, silicon nitride, silicon nitride oxide, silicon oxynitride, aluminum nitride, aluminum nitride oxide, or the like can be used as the insulating films 712 and 713. In particular, the insulating films 712 and 713 are preferably formed using low dielectric constant (low-k) materials because capacitance due to overlapping of electrodes or wirings can be substantially reduced. Note that porous insulating films including such a material may be used as the insulating films 712 and 713. Since the porous insulating film has lower dielectric constant than a dense insulating layer, parasitic capacitance due to overlapping of electrodes or wirings can be further reduced.

In this embodiment, silicon oxynitride is used for the insulating film 712, and silicon nitride oxide is used for the insulating film 713. In addition, although the insulating films 712 and 713 are formed over the gate electrode 707 in this embodiment, in the present invention, only one insulating film may be formed over the gate electrode 707, or a plurality of insulating films of three or more layers may be stacked over the gate electrode 707.

Figure 5B:
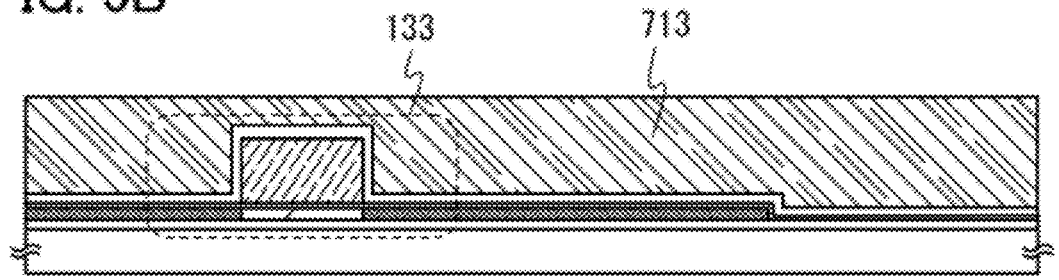

Next, as illustrated in FIG. 5B, the insulating film 713 is subjected to chemical mechanical polishing (CMP) or etching, so that a top surface of the insulating film 713 is planarized. Note that in order to improve the characteristics of the transistor 11 which is formed later, a surface of the insulating film 713 is preferably planarized as much as possible.

Through the above steps, the transistor 133 can be formed.

Figure 5C:
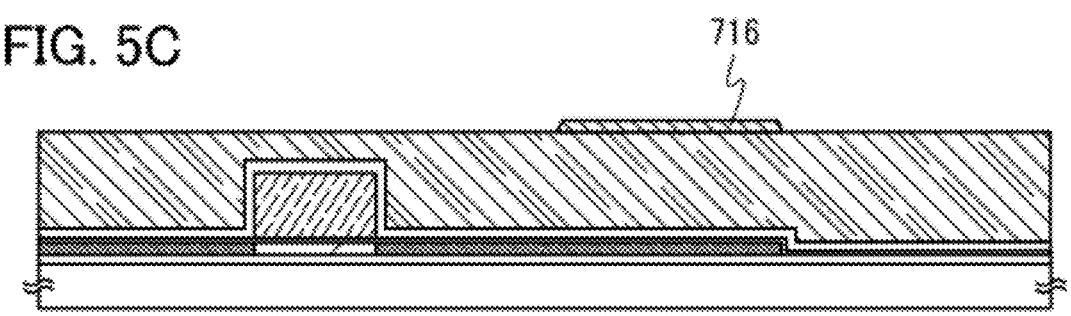

Next, a method for forming the transistor 11 is described. First, as illustrated in FIG. 5C, an oxide semiconductor layer 716 is formed over the insulating film 713.

The oxide semiconductor layer 716 includes at least one or more elements selected from In, Ga, Sn, and Zn. For example, a quaternary metal oxide such as an In—Sn—Ga—Zn—O-based oxide semiconductor; a ternary metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, or a Hf—In—Zn—O-based oxide semiconductor; a binary metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; or a unary metal oxide such as an In—O-based oxide semiconductor, a Sn—O-based oxide semiconductor, or a Zn—O-based oxide semiconductor can be used. In addition, the oxide semiconductor may contain an element other than In, Ga, Sn, and Zn, for example, $SiO_2$.

For example, an In—Sn—Zn—O-based oxide semiconductor means an oxide semiconductor containing indium (In), tin (Sn), and zinc (Zn), and there is no limitation on the composition ratio. For example, an In—Ga—Zn—O-based oxide semiconductor means an oxide semiconductor containing indium (In), gallium (Ga), and zinc (Zn), and there is no limitation on the composition ratio. An In—Ga—Zn—O-based oxide semiconductor can be referred to as IGZO.

In the case where an In—Sn—Zn—O-based material is used for the oxide semiconductor, an oxide target with an atomic ratio of In:Sn:Zn=1:2:2, 2:1:3, 1:1:1, 20:45:35, or the like is used.

For the oxide semiconductor layer 716, a thin film represented by a chemical formula, $InMO_3(ZnO)_m$ (m>0), can be used. Here, M denotes one or more metal elements selected from Zn, Ga, Al, Mn, and Co. For example, M can be Ga, Ga and Al, Ga and Mn, Ga and Co, or the like.

In the case where an In—Zn—O-based material is used for the oxide semiconductor, an oxide target with an atomic ratio of In:Zn=50:1 to 1:2 ($In_2O_3$:ZnO=25:1 to 1:4 in a molar ratio), preferably In:Zn=20:1 to 1:1 ($In_2O_3$:ZnO=10:1 to 1:2 in a molar ratio), more preferably In:Zn=1.5:1 to 15:1 ($In_2O_3$:ZnO=3:4 to 15:2 in a molar ratio) is used. For example, an oxide target with an atomic ratio of In:Zn:O=X:Y:Z, where Z>1.5X+Y, is used.

Note that it is preferable that impurities such as moisture or hydrogen which serve as electron donors (donors) be reduced in the oxide semiconductor layer 716. Specifically, the concentration of hydrogen in the oxide semiconductor layer 716 that is measured by secondary ion mass spectrometry (SIMS) is $5 \times 10^{19}/cm^3$ or lower, preferably $5 \times 10^{18}/cm^3$ or lower, more preferably $5 \times 10^{17}/cm^3$ or lower, still more preferably $1 \times 10^{16}/cm^3$ or lower.

The analysis of the concentration of hydrogen in the oxide semiconductor layer 716 is described here. The concentration of hydrogen in the oxide semiconductor layer is measured by secondary ion mass spectrometry. It is known that it is difficult to obtain precise data in the vicinity of a surface of a sample or in the vicinity of an interface between stacked layers formed using different materials by SIMS in principle. Thus, in the case where the distribution of the concentration of hydrogen in the layer in a thickness direction is analyzed by SIMS, an average value in a region of the layer in which the value is not greatly changed and is practically constant can be obtained is employed as the hydrogen concentration. In addition, in the case where the thickness of the layer is small, a region where a practically constant value can be obtained cannot be found in some cases due to the influence of the hydrogen concentration of the layers adjacent to each other. In that case, the maximum value or the minimum value of the hydrogen concentration in the region of the layer is employed as the hydrogen concentration of the layer. Further, in the case where a mountain-shaped peak having the maximum value or a valley-shaped peak having the minimum value do not exist in the region of the layer, the value at an inflection point is employed as the hydrogen concentration.

The oxide semiconductor layer 716 can be formed by processing an oxide semiconductor film formed over the insulating film 713 into a desired shape. The thickness of the oxide semiconductor film is 2 to 200 nm, preferably 3 to 50 nm, more preferably 3 to 20 nm. The oxide semiconductor film is deposited by sputtering using an oxide semiconductor as a target. The oxide semiconductor film can be formed by sputtering in a rare gas (e.g., argon) atmosphere, an oxygen atmosphere, or a mixed atmosphere of a rare gas (e.g., argon) and oxygen.

It is important to reduce not only the concentration of hydrogen in the target but also water and hydrogen in a chamber as much as possible in the case where the oxide semiconductor layer 716 is formed by sputtering. Specifically, for example, it is effective to bake the inside of the chamber before formation of the oxide semiconductor layer 716, to reduce the concentrations of water and hydrogen in a gas introduced into the chamber, or to prevent counter flow in an exhaustion system for exhausting the gas from the chamber.

Before the oxide semiconductor film is deposited by sputtering, dust on the surface of the insulating film 713 may be removed by reverse sputtering in which an argon gas is introduced and plasma is generated. The reverse sputtering is a method in which, without application of voltage to a target side, an RF power source is used for application of voltage to a substrate side in an argon atmosphere and plasma is generated in the vicinity of the substrate so that a substrate surface is modified. Note that nitrogen, helium, or the like may be used instead of the argon atmosphere. Alternatively, an argon atmosphere to which oxygen, nitrous oxide, or the like is added may be used. Alternatively, an argon atmosphere to which chlorine, carbon tetrafluoride, or the like is added may be used.

In order that hydrogen, a hydroxyl group, and moisture be contained in the oxide semiconductor film as little as possible, an impurity such as hydrogen or moisture that is adsorbed on the substrate 700 may be eliminated and exhausted by preheating of the substrate 700 over which the insulating films 712 and 713 are formed in a preheating chamber of a sputtering apparatus, as pretreatment for deposition. The temperature of the preheating is 100 to 400° C., preferably 150 to 300° C. As an exhaustion means provided in the preheating chamber, a cryopump is preferable. Note that the preheating treatment can be omitted. This preheating may be similarly performed on the substrate 700 before the formation of an insulating film 717.

In this embodiment, a 30-nm-thick In—Ga—Zn—O-based oxide semiconductor thin film which is formed by sputtering using a target including indium (In), gallium (Ga), and zinc (Zn) is used as the oxide semiconductor film. A target with a composition ratio of metals, In:Ga:Zn=1:1:0.5, In:Ga:Zn=1:1:1, or In:Ga:Zn=1:1:2 can be used as the target, for example. The filling factor of the target including In, Ga, and Zn is higher than or equal to 90% and lower than or equal to 100%, preferably higher than or equal to 95% and lower than 100%. With the use of a target with a high filling factor, a dense oxide semiconductor film is formed.

In this embodiment, the oxide semiconductor film is deposited in such a manner that the substrate is held in a treatment chamber kept at reduced pressure, moisture remaining in the treatment chamber is removed, a sputtering gas from which hydrogen and moisture are removed is introduced, and the target is used. The substrate temperature may be 100 to 600° C., preferably 200 to 400° C. during deposition. By deposition of the oxide semiconductor film while the substrate is heated, the concentration of impurities included in the deposited oxide semiconductor film can be lowered. In addition, damage by sputtering can be reduced. In order to remove moisture remaining in the treatment chamber, an adsorption vacuum pump is preferably used. For example, a cryopump, an ion pump, or a titanium sublimation pump is preferably used. A turbo pump to which a cold trap is added may be used as an exhaustion means. For example, a hydrogen atom, a compound containing a hydrogen atom, such as water (preferably a compound containing a carbon atom), and the like are exhausted from the treatment chamber with the use of a cryopump. Thus, the concentration of impurities contained in the oxide semiconductor film deposited in the treatment chamber can be lowered.

As an example of the deposition condition, the following condition is employed: the distance between the substrate and the target is 100 mm, the pressure is 0.6 Pa, the direct current (DC) power is 0.5 kW, and the atmosphere is an oxygen atmosphere (the proportion of the oxygen flow rate is 100%). Note that it is preferable that pulsed direct-current (DC) power be used because dust generated during deposition can be reduced and the film thickness can be uniform.

Further, when the leakage rate of the treatment chamber of the sputtering apparatus is set to $1\times10^{-10}$ Pa·m³/s or lower, mixing of impurities such as alkali metal or hydride into the oxide semiconductor film that is being deposited by sputtering can be reduced. Furthermore, with the use of the adsorption vacuum pump as an evacuation system, counter flow of impurities such as alkali metal, a hydrogen atom, a hydrogen molecule, water, a hydroxyl group, or hydride from the evacuation system can be reduced.

When the purity of the target is set to 99.99% or higher, alkali metal, a hydrogen atom, a hydrogen molecule, water, a hydroxyl group, hydride, or the like mixed into the oxide semiconductor film can be reduced. In addition, with the use of the target, the concentration of an alkali metal such as lithium, sodium, or potassium can be reduced in the oxide semiconductor film.

Note that it has been pointed out that an oxide semiconductor is insensitive to impurities, there is no problem when a considerable amount of metal impurities is contained in the film, and soda-lime glass which contains a large amount of alkali metal such as sodium (Na) and is inexpensive can be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). But such consideration is not appropriate. Alkali metal is not an element included in an oxide semiconductor and thus is an impurity. Alkaline earth metal is also an impurity in the case where alkaline earth metal is not included in an oxide semiconductor. Alkali metal, in particular, Na becomes Na⁺ when an insulating film which is in contact with an oxide semiconductor layer is an oxide and Na diffuses into the insulating film. In addition, in the oxide semiconductor layer, Na cuts or enters a bond between metal and oxygen which are included in an oxide semiconductor. As a result, for example, degradation in transistor characteristics, such as a normally on state of the transistor due to a shift in the threshold voltage in a negative direction, or a decrease in mobility, occurs. A variation in characteristics also occurs. Such degradation in transistor characteristics and a variation in characteristics due to the impurity are outstanding when the concentration of hydrogen in the oxide semiconductor layer is sufficiently low. Thus, when the concentration of hydrogen in the oxide semiconductor layer is $1\times10^{18}/cm^3$ or lower, preferably $1\times10^{17}/cm^3$ or lower, the concentration of the impurity is preferably lowered. Specifically, the measurement value of a Na concentration by secondary ion mass spectrometry is preferably $5\times10^{16}/cm^3$ or less, more preferably $1\times10^{16}/cm^3$ or less, still more preferably $1\times10^{15}/cm^3$ or less. Similarly, the measurement value of a Li concentration is preferably $5\times10^{15}/cm^3$ or less, more preferably $1\times10^{15}/cm^3$ or less. Similarly, the measurement value of a K concentration is preferably $5\times10^{15}/cm^3$ or less, more preferably $1\times10^{15}/cm^3$ or less.

An oxide semiconductor film can be single crystal, polycrystalline (also referred to as polycrystal), or amorphous, for example.

The oxide semiconductor film is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits into a cube whose one side is less than 100 nm. From an observation image obtained with a transmission electron microscope (TEM), a boundary between the amorphous part and a crystal part in the CAAC-oxide semiconductor film is not clear. Further, with the TEM, a grain boundary in the CAAC-oxide semiconductor film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic order which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85 to 95°. In addition, a simple term "parallel" includes a range from −5 to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the CAAC-OS film is higher than that in the vicinity of the surface where the CAAC-OS film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to the normal vector of the surface where the CAAC-OS film is formed or the normal vector of the surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to the normal vector of the surface where the CAAC-OS film is formed or the normal vector of the surface of the CAAC-OS film. The crystal part is formed by deposition or by performing treatment for crystallization such as heat treatment after deposition.

With the use of the CAAC-OS film in a transistor, a change in electrical characteristics of the transistor due to irradiation with visible light or ultraviolet light can be reduced. Thus, the transistor has high reliability.

Note that part of oxygen included in the oxide semiconductor film may be substituted with nitrogen.

Examples of a crystal structure of CAAC are described in detail with reference to FIGS. 10A to 10E, FIGS. 11A to 11C, and FIGS. 12A to 12C. Note that in FIGS. 10A to 10E, FIGS. 11A to 11C, and FIGS. 12A to 12C, the vertical direction corresponds to the c-axis direction and a plane perpendicular to the c-axis direction corresponds to the a-b plane, unless otherwise specified. When terms "upper half" and "lower half" are simply used, they refer to an upper half above the a-b plane and a lower half below the a-b plane (an upper half and a lower half with respect to the a-b plane). Further, in FIGS. 10A to 10E, an O atom surrounded by a circle represents a tetracoordinate O atom and an O atom surrounded by a double circle represents a tricoordinate O atom.

Figure 10A:
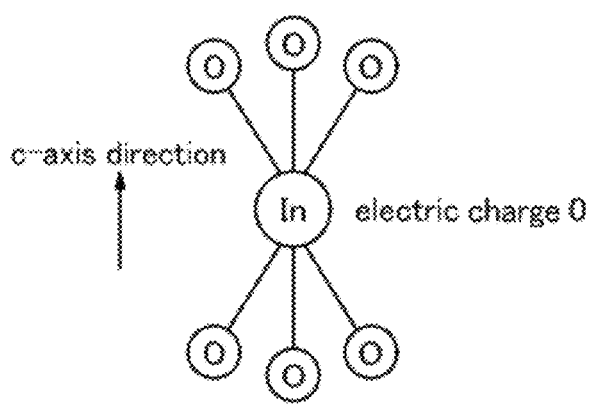
FIGS. 10A to 10E each illustrate the structure of an oxide semiconductor layer.

FIG. 10A illustrates a structure including one hexacoordinate In atom and six tetracoordinate oxygen atoms (hereinafter referred to as tetracoordinate O atoms) close to the In atom. A structure in which one In atom and oxygen atoms close to the In atom are only illustrated is called a subunit here. The structure in FIG. 10A is actually an octahedral structure, but is illustrated as a planar structure for simplicity. Note that three tetracoordinate O atoms exist in each of an upper half and a lower half in FIG. 10A. In the subunit illustrated FIG. 10A, electric charge is 0.

Figure 10D:
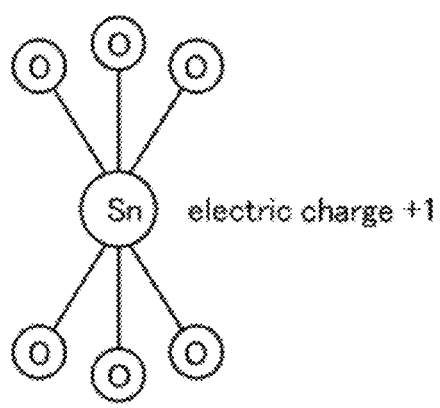
Figure 10B:
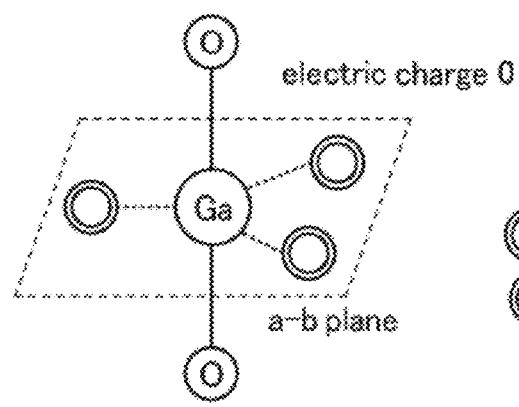

FIG. 10B illustrates a structure including one pentacoordinate Ga atom, three tricoordinate oxygen atoms (hereinafter referred to as tricoordinate O atoms) close to the Ga atom, and two tetracoordinate O atoms close to the Ga atom. All the tricoordinate O atoms exist in the a-b plane. One tetracoordinate O atom exists in each of an upper half and a lower half in FIG. 10B. An In atom can have the structure illustrated in FIG. 10B because the In atom can have five ligands. In a subunit illustrated FIG. 10B, electric charge is 0.

Figure 10E:
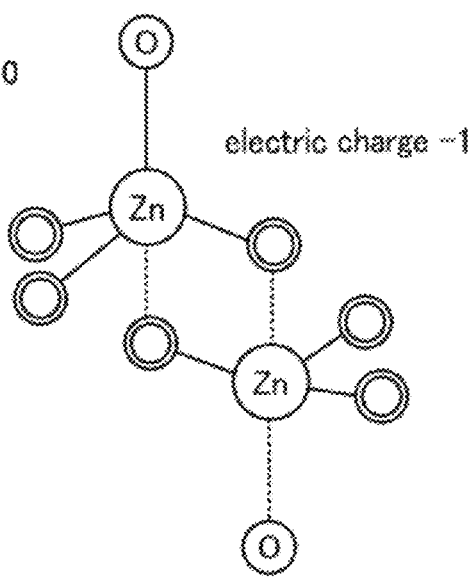
Figure 10C:
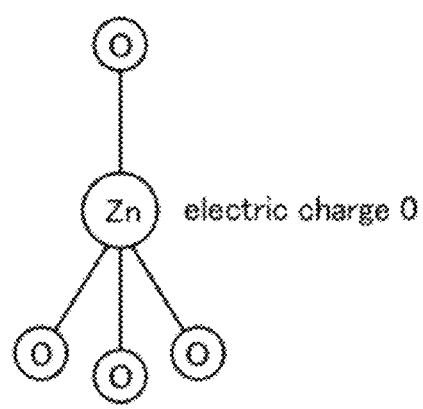

FIG. 10C illustrates a structure including one tetracoordinate Zn atom and four tetracoordinate O atoms close to the Zn atom. In FIG. 10C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 10C. In a subunit illustrated FIG. 10C, electric charge is 0.

FIG. 10D illustrates a structure including one hexacoordinate Sn atom and six tetracoordinate O atoms close to the Sn atom. In FIG. 10D, three tetracoordinate O atoms exist in each of an upper half and a lower half In a subunit illustrated FIG. 10D, electric charge is +1.

FIG. 10E illustrates a subunit including two Zn atoms. In FIG. 10E, one tetracoordinate O atom exists in each of an upper half and a lower half In the subunit illustrated FIG. 10E, electric charge is −1.

Here, a group of some subunits is referred to as one group, and some of the groups are referred to as one unit.

Here, a rule of bonding the subunits to each other is described. The three O atoms in the upper half with respect to the hexacoordinate In atom in FIG. 10A each have three proximity In atoms in the downward direction, and the three O atoms in the lower half each have three proximity In atoms in the upward direction. The one O atom in the upper half with respect to the pentacoordinate Ga atom in FIG. 10B has one proximity Ga atom in the downward direction, and the one O atom in the lower half has one proximity Ga atom in the upward direction. The one O atom in the upper half with respect to the tetracoordinate Zn atom in FIG. 10C has one proximity Zn atom in the downward direction, and the three O atoms in the lower half each have three proximity Zn atoms in the upward direction. In this manner, the number of the tetracoordinate O atoms above the metal atom is equal to the number of the proximity metal atoms below the tetracoordinate O atoms. Similarly, the number of the tetracoordinate O atoms below the metal atom is equal to the number of the proximity metal atoms above the tetracoordinate O atoms. Since the coordination number of the O atom is 4, the sum of the number of the proximity metal atoms below the O atom and the number of the proximity metal atoms above the O atom is 4. Accordingly, when the sum of the number of the tetracoordinate O atoms above the metal atom and the number of the tetracoordinate O atoms below another metal atom is 4, the two kinds of subunits including the metal atoms can be bonded to each other. For example, in the case where the hexacoordinate metal (In or Sn) atom is bonded through three tetracoordinate O atoms in the upper half, the hexacoordinate metal atom is bonded to a pentacoordinate metal (Ga or In) atom or a tetracoordinate metal (Zn) atom.

A metal atom having the above coordination number is bonded to another metal atom through a tetracoordinate O atom in the c-axis direction. Further, subunits are bonded to each other so that the total electric charge in a layer structure is 0. Thus, one group is constituted.

Figure 11A:
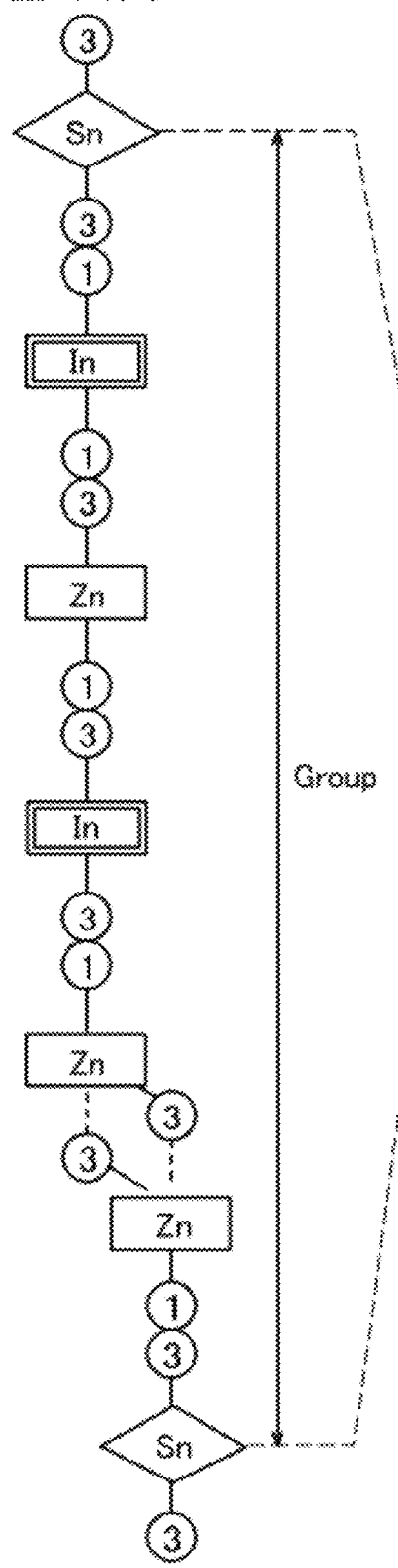
FIGS. 11A to 11C illustrate the structure of an oxide semiconductor layer.
Figure 11B:
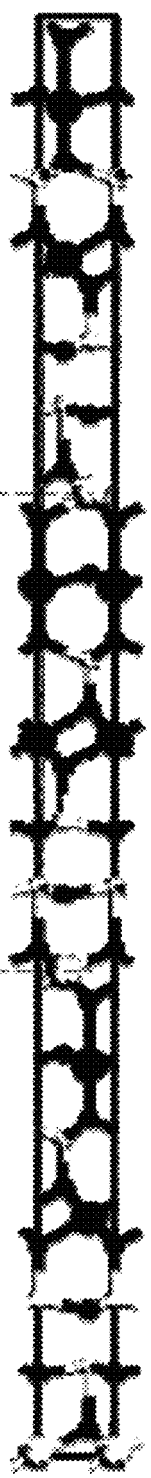
Figure 11C:
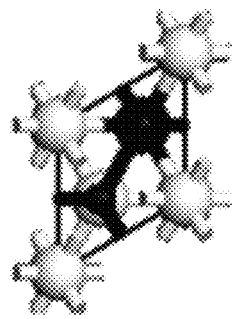

FIG. 11A illustrates a model of one group included in a layer structure of an In—Sn—Zn—O-based material. FIG. 11B illustrates a unit including three groups. Note that FIG. 11C illustrates atomic order in the case of the layer structure in FIG. 11B observed from the c-axis direction.

In FIG. 11A, for simplicity, a tricoordinate O atom is not illustrated and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 11A, one tetracoordinate O atom existing in each of an upper half and a lower half with respect to an In atom is denoted by circled 1. FIG. 11A also illustrates a Zn atom close to one tetracoordinate O atom in a lower half and three tetracoordinate O atoms in an upper half, and a Zn atom close to one tetracoordinate O atom in an upper half and three tetracoordinate O atoms in a lower half.

In the group included in the layer structure of the In—Sn—Zn—O-based material in FIG. 11A, in the order starting from the top, a Sn atom close to three tetracoordinate O atoms in each of an upper half and a lower half is bonded to an In atom close to one tetracoordinate O atom in each of an upper half and a lower half, the In atom is bonded to a Zn atom close to three tetracoordinate O atoms in an upper half, the Zn atom is bonded to an In atom close to three tetracoordinate O atoms in each of an upper half and a lower half through one tetracoordinate O atom in a lower half with respect to the Zn atom, the In atom is bonded to a subunit that includes two Zn atoms and is close to one tetracoordinate O atom in an upper half, and the subunit is bonded to a Sn atom close to three tetracoordinate O atoms in each of an upper half and a lower half through one tetracoordinate O atom in a lower half with respect to the subunit. Some of the groups are bonded to each other so that one unit is constituted.

Here, electric charge for one bond of a tricoordinate O atom and electric charge for one bond of a tetracoordinate O atom can be assumed to be −0.667 and −0.5, respectively. For example, electric charge of a hexacoordinate or pentacoordinate In atom, electric charge of a tetracoordinate Zn atom, and electric charge of a pentacoordinate or hexacoordinate Sn atom are +3, +2, and +4, respectively. Thus, electric charge of a subunit including a Sn atom is +1. Consequently, an electric charge of −1, which cancels an electric charge of +1, is needed to form a layer structure including a Sn atom. As a structure having an electric charge of −1, the subunit including two Zn atoms as illustrated in FIG. 10E can be given. For example, when one subunit including two Zn atoms is provided for one subunit including a Sn atom, electric charge is canceled, so that the total electric charge in the layer structure can be 0.

An In atom can have either five ligands or six ligands. Specifically, when a unit illustrated in FIG. 11B is formed, In—Sn—Zn—O-based crystal ($In_2SnZn_3O_8$) can be obtained. Note that the layer structure of the obtained In—Sn—Zn—O-based crystal can be expressed as a composition formula, $In_2SnZn_2O_7(ZnO)$, (m is 0 or a natural number).

The above rule also applies to the following oxides: a quaternary metal oxide such as an In—Sn—Ga—Zn—O-based oxide; a ternary metal oxide such as an In—Ga—Zn—O-based oxide (also referred to as IGZO), an In—Al—Zn—O-based oxide, a Sn—Ga—Zn—O-based oxide, an Al—Ga—Zn—O-based oxide, or a Sn—Al—Zn—O-based oxide; a binary metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide; or a unary metal oxide such as an In—O-based oxide, a Sn—O-based oxide, or a Zn—O-based oxide is used.

Figure 12A:
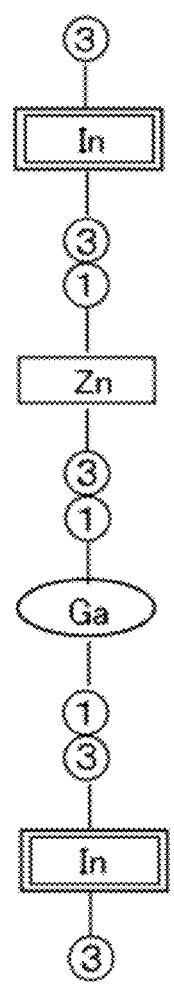
FIGS. 12A to 12C illustrate the structure of an oxide semiconductor layer.

For example, FIG. 12A illustrates a model of one group included in a layer structure of an In—Ga—Zn—O-based material.

In the group included in the layer structure of the In—Ga—Zn—O-based material in FIG. 12A, in the order starting from the top, an In atom close to three tetracoordinate O atoms in each of an upper half and a lower half is bonded to a Zn atom close to one tetracoordinate O atom in an upper half, the Zn atom is bonded to a Ga atom close to one tetracoordinate O atom in each of an upper half and a lower half through three tetracoordinate O atoms in a lower half with respect to the Zn atom, and the Ga atom is bonded to an In atom close to three tetracoordinate O atoms in each of an upper half and a lower half through one tetracoordinate O atom in a lower half with respect to the Ga atom. Some of the groups are bonded to each other so that one unit is constituted.

Figure 12B:
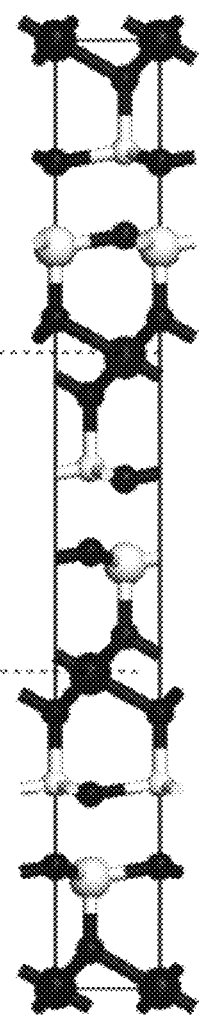
Figure 12C:
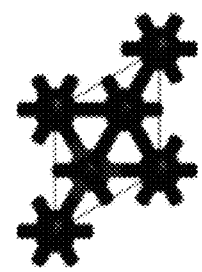

FIG. 12B illustrates a unit including three groups. Note that FIG. 12C illustrates atomic order in the case of the layer structure in FIG. 12B observed from the c-axis direction.

Here, since electric charge of a hexacoordinate or pentacoordinate In atom, electric charge of a tetracoordinate Zn atom, and electric charge of a pentacoordinate Ga atom are +3, +2, and +3, respectively, electric charge of a subunit including any of an In atom, a Zn atom, and a Ga atom is 0. Thus, the total electric charge of a group having a combination of such subunits is always 0.

In order to form the layer structure of the In—Ga—Zn—O-based material, a group can be formed using not only the group illustrated in FIG. 12A but also a group in which arrangement of an In atom, a Ga atom, and a Zn atom is different from that in FIG. 12A.

A CAAC-OS film can be formed by sputtering. The above material can be used as a target material. In the case where the CAAC-OS film is formed by sputtering, the proportion of an oxygen gas in an atmosphere is preferably high. In the case where sputtering is performed in a mixed gas of argon and oxygen, for example, the proportion of an oxygen gas is preferably 30% or higher, more preferably 40% or higher because supply of oxygen from the atmosphere promotes crystallization of the CAAC-OS film.

In the case where the CAAC-OS film is formed by sputtering, a substrate over which the CAAC-OS film is formed is heated preferably to 150° C. or higher, more preferably to 170° C. or higher. This is because the higher the substrate temperature becomes, the more crystallization of the CAAC-OS film is promoted.

After heat treatment is performed on the CAAC-OS film in a nitrogen atmosphere or in vacuum, heat treatment is preferably performed in an oxygen atmosphere or a mixed gas of oxygen and another gas. This is because oxygen deficiency due to the former heat treatment can be corrected by supply of oxygen from the atmosphere in the latter heat treatment.

A film surface on which the CAAC-OS film is formed (a deposition surface) is preferably flat. This is because the c-axis approximately perpendicular to the deposition surface exists in the CAAC-OS film, so that deposition surface irregularities induce generation of grain boundaries in the CAAC-OS film. Thus, planarization treatment such as chemical mechanical polishing (CMP) is preferably performed on the deposition surface before the CAAC-OS film is formed. The average roughness of the deposition surface is preferably 0.5 nm or less, more preferably 0.3 nm or less.

Note that an oxide semiconductor film formed by sputtering or the like contains a moisture or hydrogen (including a hydroxyl group) as an impurity in some cases. In one embodiment of the present invention, in order to reduce impurities such as moisture or hydrogen in the oxide semiconductor film (in order to perform dehydration or dehydrogenation), heat treatment is performed on the oxide semiconductor film in a reduced-pressure atmosphere, an inert gas atmosphere of nitrogen, a rare gas, or the like, an oxygen gas atmosphere, or ultra dry air (the moisture amount is 20 ppm (−55° C. by conversion into a dew point) or less, preferably 1 ppm or less, more preferably 10 ppb or less, in the case where measurement is performed by a dew point meter in a cavity ring-down laser spectroscopy (CRDS) method).

By performing heat treatment on the oxide semiconductor film, moisture or hydrogen in the oxide semiconductor film can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for 3 to 6 minutes. When RTA is used for the heat treatment, dehydration or dehydrogenation can be performed in a short time; thus, treatment can be performed even at a temperature higher than the strain point of a glass substrate.

In this embodiment, an electric furnace that is one of heat treatment apparatuses is used.

Note that the heat treatment apparatus is not limited to an electric furnace, and may be provided with a device for heating an object by thermal conduction or thermal radiation from a heater such as a resistance heater. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. An inert gas which does not react with an object by heat treatment, such as nitrogen or a rare gas (e.g., argon), is used as the gas.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6N (99.9999%) or higher, more preferably 7N (99.99999%) or higher (that is, the impurity concentration is 1 ppm or lower, preferably 0.1 ppm or lower).

Through the step, the concentration of hydrogen in the oxide semiconductor film can be lowered.

After moisture or hydrogen in the oxide semiconductor film is eliminated in this manner, oxygen is added (supplied) to the oxide semiconductor film (or an oxide semiconductor layer formed using the oxide semiconductor film). Thus, oxygen defects, for example, in the oxide semiconductor film (the oxide semiconductor layer) or at an interface of the oxide semiconductor film (the oxide semiconductor layer) can be reduced, so that the oxide semiconductor layer can be intrinsic or substantially intrinsic.

Oxygen can be added in such a manner, for example, that an insulating film including a region where the proportion of oxygen is higher than the stoichiometric proportion is formed in contact with the oxide semiconductor film (or the oxide semiconductor layer formed using the oxide semiconductor film), and then heat treatment is performed. In this manner, excessive oxygen in the insulating film can be supplied to the oxide semiconductor film (the oxide semiconductor layer). Thus, the oxide semiconductor film (the oxide semiconductor layer) can contain oxygen excessively. Oxygen contained excessively exists, for example, between lattices of a crystal included in the oxide semiconductor film (the oxide semiconductor layer).

Note that the insulating film including a region where the proportion of oxygen is higher than the stoichiometric proportion may be applied to either the insulating film placed on an upper side of the oxide semiconductor film (the oxide semiconductor layer) or the insulating film placed on a lower side of the oxide semiconductor film (the oxide semiconductor layer) of the insulating films which are in contact with the oxide semiconductor film (the oxide semiconductor layer); however, it is preferable to apply such an insulating film to both the insulating films which are in contact with the oxide semiconductor film (the oxide semiconductor layer). The above effect can be enhanced with a structure where the oxide semiconductor film (the oxide semiconductor layer) is provided between the insulating films each including a region where the proportion of oxygen is higher than the stoichiometric proportion, which are used as the insulating films in contact with the oxide semiconductor film (the oxide semiconductor layer) and positioned on the upper side and the lower side of the oxide semiconductor film (the oxide semiconductor layer).

Here, the insulating film including a region where the proportion of oxygen is higher than the stoichiometric proportion may be a single-layer insulating film or a plurality of insulating films stacked. Note that the insulating film preferably includes impurities such as moisture or hydrogen as little as possible. When hydrogen is contained in the insulating film, hydrogen enters the oxide semiconductor film (the oxide semiconductor layer) or oxygen in the oxide semiconductor film (the oxide semiconductor layer) is extracted by hydrogen, whereby the oxide semiconductor film has lower resistance (n-type conductivity); thus, a parasitic channel might be formed. Thus, it is important that a deposition method in which hydrogen is not used be employed in order to form the insulating film containing hydrogen as little as possible. A material having a high barrier property is preferably used for the insulating film. As the insulating film having a high barrier property, a silicon nitride film, a silicon nitride oxide film, an aluminum nitride film, an aluminum oxide film, an aluminum nitride oxide film, or the like can be used, for example. When a plurality of insulating films stacked are used, an insulating film having a low proportion of nitrogen, such as a silicon oxide film or a silicon oxynitride film, is formed on a side which is closer to the oxide semiconductor film (the oxide semiconductor layer) than the insulating film having a high barrier property. Then, the insulating film having a high barrier property is formed to overlap with the oxide semiconductor film (the oxide semiconductor layer) with the insulating film having a low proportion of nitrogen sandwiched therebetween. When the insulating film having a high barrier property is used, impurities such as moisture or hydrogen can be prevented from entering the oxide semiconductor film (the oxide semiconductor layer) or the interface between the oxide semiconductor film (the oxide semiconductor layer) and another insulating film and the vicinity thereof. In addition, the insulating film having a low proportion of nitrogen, such as a silicon oxide film or a silicon oxynitride film, is formed to be in contact with the oxide semiconductor film (the oxide semiconductor layer), so that the insulating film having a high barrier property can be prevented from being in direct contact with the oxide semiconductor film (the oxide semiconductor layer).

Alternatively, addition of oxygen after moisture or hydrogen in the oxide semiconductor film (the oxide semiconductor layer) is eliminated may be performed by performing heat treatment on the oxide semiconductor film (the oxide semiconductor layer) in an oxygen atmosphere. It is preferable that an oxygen gas used for the heat treatment in an oxygen atmosphere do not include water, hydrogen, or the like. Alternatively, the purity of the oxygen gas which is introduced into a heat treatment apparatus is preferably 6N (99.9999%) or higher, more preferably 7N (99.99999%) or higher (that is, the impurity concentration in oxygen is 1 ppm or lower, preferably 0.1 ppm or lower).

Alternatively, addition of oxygen after moisture or hydrogen in the oxide semiconductor film (the oxide semiconductor layer) is eliminated may be performed by ion implantation, ion doping, or the like. For example, oxygen made to be plasma with a microwave of 2.45 GHz may be added to the oxide semiconductor film (the oxide semiconductor layer).

The thus formed oxide semiconductor film is etched so that the oxide semiconductor layer 716 is formed. Alternatively, the oxide semiconductor layer 716 is formed using the thus formed oxide semiconductor layer.

Figure 5D:
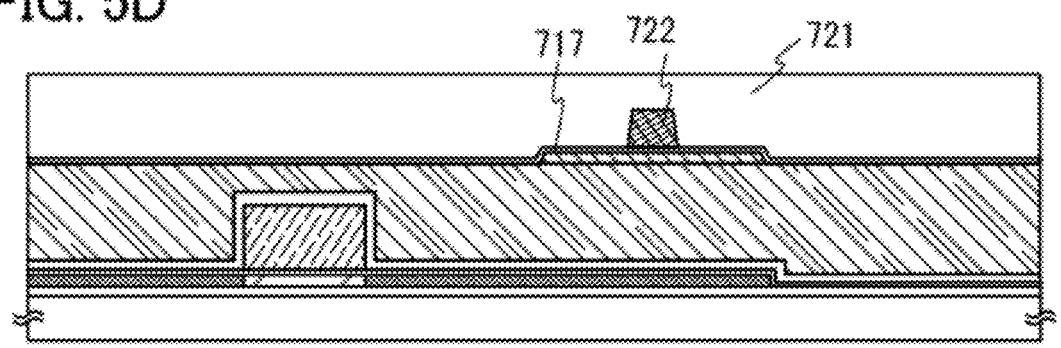

Next, as illustrated in FIG. 5D, the insulating film 717 is formed over the oxide semiconductor layer 716. Note that the insulating film 717 may be used as the insulating film including a region where the proportion of oxygen is higher than the stoichiometric proportion. Then, over the insulating film 717, a gate electrode 722 is formed to overlap with the oxide semiconductor layer 716. After that, an insulating film 721 is formed over the gate electrode 722.

The gate electrode 722 can be formed in such a manner that a conductive film is formed over the insulating film 717 and then is etched. The gate electrode 722 can be formed using a material which is similar to the material of the gate electrode 707.

The thickness of the gate electrode 722 is 10 to 400 nm, preferably 100 to 200 nm. In this embodiment, after a 150-nm-thick conductive film for the gate electrode is formed by sputtering using a tungsten target, the conductive film is processed into a desired shape by etching, so that the gate electrode 722 is formed. A resist mask may be formed by an inkjet method. When the resist mask is formed by an inkjet method, a photomask is not used; thus, manufacturing cost can be reduced.

Figure 6A:
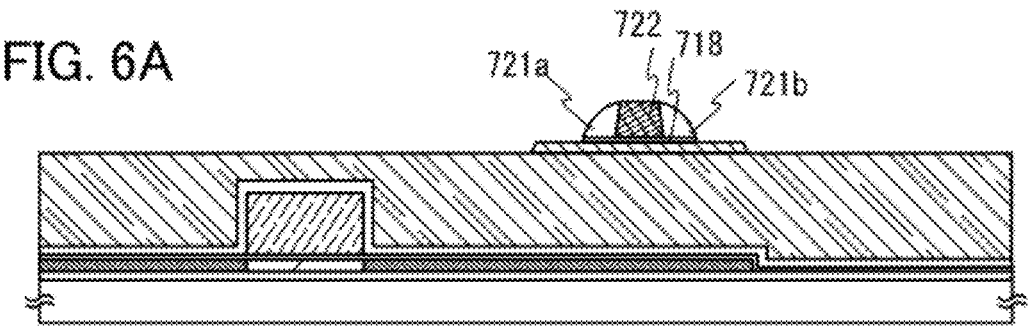
FIGS. 6A to 6D illustrate steps of forming the comparator.

Then, as illustrated in FIG. 6A, the insulators 721a and 721b which are provided on side surfaces of the gate electrode 722 and function as side walls, and the insulating layer 718 which remains in a portion overlapping with the gate electrode 722 and the insulators 721a and insulator 721b and functions as a gate insulating film are formed by anisotropic etching performed in a direction perpendicular to a surface of the substrate 700.

Figure 6B:
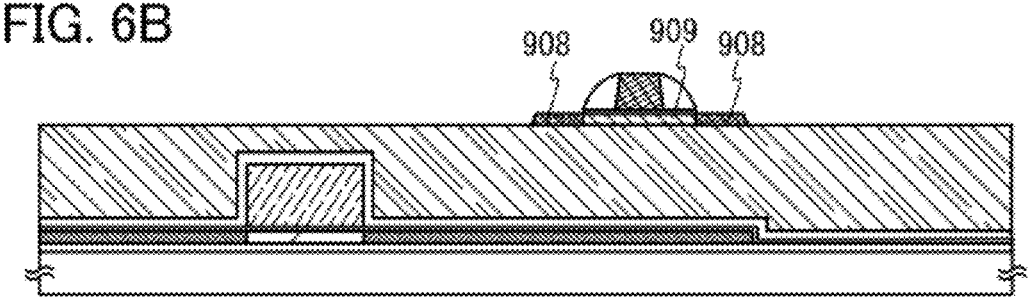

Then, as illustrated in FIG. 6B, the pair of high-concentration regions 908 and the region 909 formed between the pair of high-concentration regions 908 are formed by addition of a dopant imparting n-type conductivity to the oxide semiconductor layer 716 with the use of the gate electrode 722 and the insulators 721a and 721b as masks. Note that in the region 909, a region which overlaps with the gate electrode 722 with the insulating layer 718 provided therebetween is a channel formation region. The dopant used for forming the high-concentration regions 908 can be added by ion implantation. A rare gas such as helium, argon, or xenon; a Group 15 atom such as nitrogen, phosphorus, arsenic, or antimony; or the like can be used as the dopant, for example. For example, in the case where nitrogen is used as the dopant, the concentration of nitrogen atoms in the high-concentration region 908 is preferably $5\times10^{19}/cm^3$ or higher and $1\times10^{22}/cm^3$ or lower. The high-concentration region 908 to which the dopant imparting n-type conductivity is added has higher conductivity than other regions in the oxide semiconductor layer 716.

Note that although FIG. 6B illustrates the case where a dopant imparting conductivity is not added to a region of the oxide semiconductor layer 716 that overlaps with the insulators 721a and 721b, this embodiment is not limited thereto. After the gate electrode 722 is formed in FIG. 5D, an impurity region may be formed in the region of the oxide semiconductor layer 716 that overlaps with the insulators 721a and 721b by addition of a dopant imparting conductivity. Alternatively, a dopant imparting conductivity may be added (first addition) after the gate electrode 722 is formed in FIG. 5D, and a dopant imparting conductivity may be added (second addition) after the insulators 721a and 721b are formed in FIG. 6B so that a low-concentration region is formed in the region overlapping with the insulators 721a and 721b. The low-concentration region has a lower concentration of an impurity element imparting conductivity than the high-concentration region 908.

Figure 6C:
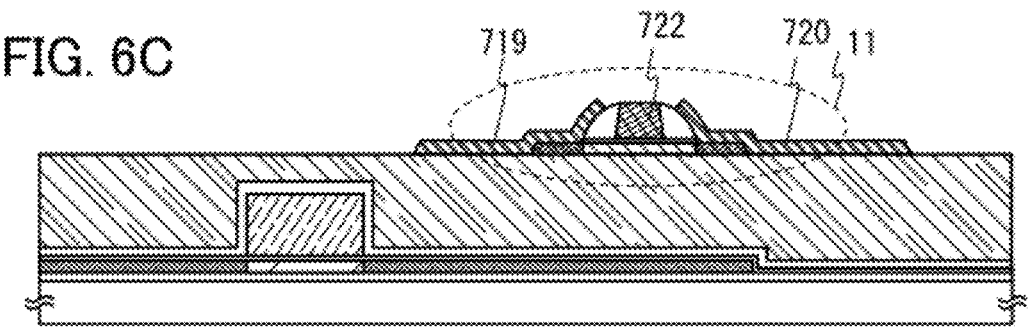

Next, as illustrated in FIG. 6C, the conductive layers 719 and 720 which are in contact with the high-concentration regions 908 are formed. The conductive layers 719 and 720 function as a source and drain electrodes.

Specifically, the conductive layers 719 and 720 can be formed in such a manner that a conductive film is formed by sputtering or vacuum vapor deposition and then is processed into a predetermined shape.

As the conductive film which serves as the conductive layers 719 and 720, any of the following materials can be used: an element selected from aluminum, chromium, copper, tantalum, titanium, molybdenum, or tungsten; an alloy including any of these elements; an alloy film including the above elements in combination; and the like. Alternatively, a structure may be employed in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which serves as the conductive layers 719 and 720 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Mo—Ti alloy, Ti, and Mo have high adhesion with an oxide film. Thus, when the conductive layers 719 and 720 are formed using a stack in which a conductive film including a Cu—Mg—Al alloy, a Mo—Ti alloy, Ti, or Mo is used for a lower layer and a conductive film including Cu is used for an upper layer, the adhesion between the insulating film 713, the insulators 721a and 721b, and the conductive layers 719 and 720 can be increased.

For the conductive film which serves as the conductive layers 719 and 720, a conductive metal oxide may be used. As the conductive metal oxide, indium oxide, tin oxide, zinc oxide, indium oxide-tin oxide, indium oxide-zinc oxide, or the conductive metal oxide material containing silicon or silicon oxide can be used.

In the case where heat treatment is performed after the formation of the conductive film, the conductive film preferably has heat resistance high enough to withstand the heat treatment.

In this embodiment, a titanium film is used as the conductive film. Thus, the conductive film can be selectively etched by wet etching using a solution (an ammonia hydrogen peroxide mixture) containing ammonia and hydrogen peroxide water. Specifically, an ammonia hydrogen peroxide mixture in which oxygenated water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

Note that in order to reduce the number of photomasks used in a photolithography process and to reduce the number of processes, etching may be performed using a multi-tone mask through which light is transmitted to have a plurality of intensities. A resist mask formed using a multi-tone mask has a plurality of thicknesses and can be changed in shape by etching; thus, the resist mask can be used in a plurality of etching processes for processing films into different patterns. Accordingly, a resist mask corresponding to at least two or more kinds of different patterns can be formed by one multi-tone mask. Thus, the number of exposure masks and the number of corresponding photolithography processes can be reduced, so that the process can be simplified.

In this manner, the transistor 11 is formed. The transistor 11 has the high-concentration regions 908, so that resistance between the source and drain electrodes (the conductive layers 719 and 720) can be lowered.

When the resistance between the source and drain electrodes (the conductive layers 719 and 720) is lowered, high on-state current and high-speed operation can be secured even when the transistor 11 is miniaturized. In addition, by miniaturization of the transistor 11, the comparator 1000 can be made small.

In the case where an In—Ga—Zn—O-based oxide semiconductor is used for the oxide semiconductor layer 716, an oxide semiconductor in the high-concentration region 908 has a wurtzite crystal structure by heat treatment at 300 to 600° C. for 1 hour after the addition of nitrogen. When the oxide semiconductor in the high-concentration region 908 has a wurtzite crystal structure, the conductivity of the high-concentration region 908 can be further increased and the resistance between the source and drain electrodes (the conductive layers 719 and 720) can be further lowered. Note that in order to effectively lower the resistance between the source and drain electrodes (the conductive layers 719 and 720) by formation of an oxide semiconductor with a wurtzite crystal structure, the concentration of nitrogen atoms in the high-concentration region 908 is preferably $1 \times 10^{20}/cm^3$ or higher and 7 at. % or lower in the case where nitrogen is used as the dopant. Even in the case where the concentration of nitrogen atoms is lower than the above range, an oxide semiconductor with a wurtzite crystal structure can be obtained in some cases.

Further, an oxide conductive film functioning as a source and drain regions may be provided between the high-concentration regions 908 and the conductive layers 719 and 720 functioning as a source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, etching for forming the oxide conductive film and etching for forming the conductive layers 719 and 720 may be performed simultaneously.

With provision of the oxide conductive film functioning as a source and drain regions, resistance between the high-concentration regions 908 and the conductive layers 719 and 720 can be lowered, so that the transistor can operate at high speed. In addition, with provision of the oxide conductive film functioning as a source and drain regions, the withstand voltage of the transistor can be increased.

In the transistor 11, the source and drain electrodes (the conductive layers 719 and 720) do not overlap with the gate electrode 722. In other words, a gap which is larger than the thickness of the insulating layer 718 is provided between the source and drain electrodes (the conductive layers 719 and 720) and the gate electrode 722. Thus, in the transistor 11, parasitic capacitance formed between the source and drain electrodes and the gate electrode can be reduced. Consequently, high-speed operation can be performed.

Note that the transistor 11 is not limited to a transistor whose channel is formed in an oxide semiconductor layer, and it is possible to use a transistor that includes a semiconductor material whose bandgap is wider than that of silicon and whose intrinsic carrier density is lower than that of silicon in a channel formation region. As such a semiconductor material, for example, silicon carbide, gallium nitride, or the like can be used instead of an oxide semiconductor. With a channel formation region including such a semiconductor material, a transistor whose off-state current is extremely low can be obtained.

Although the transistor 11 is a single-gate transistor, a multi-gate transistor including a plurality of channel formation regions can be formed when a plurality of gate electrodes electrically connected to each other are included when needed.

Note that an insulating film which is in contact with the oxide semiconductor layer 716 (in this embodiment, corresponding to the insulating layer 718) may be formed using an insulating material containing a Group 13 element and oxygen. Many oxide semiconductor materials contain a Group 13 element, and an insulating material containing a Group 13 element works well with an oxide semiconductor. By using such an insulating material containing a Group 13 element for the insulating film which is in contact with the oxide semiconductor layer, the state of an interface with the oxide semiconductor layer can be kept well.

An insulating material containing a Group 13 element is an insulating material containing one or more Group 13 elements. Examples of the insulating material containing a Group 13 element include gallium oxide, aluminum oxide, aluminum gallium oxide, and gallium aluminum oxide. Here, aluminum gallium oxide is a material whose content of aluminum is larger than the content of gallium in an atomic percent, and gallium aluminum oxide is a material whose content of gallium is larger than or equal to the content of aluminum in an atomic percent.

For example, in the case where an insulating film is formed in contact with an oxide semiconductor layer containing gallium, when a material containing gallium oxide is used for the insulating film, favorable characteristics can be kept at the interface between the oxide semiconductor layer and the insulating film. For example, when the oxide semiconductor layer and the insulating film containing gallium oxide are provided in contact with each other, pile up of hydrogen at the interface between the oxide semiconductor layer and the insulating film can be reduced. Note that a similar effect can be obtained in the case where an element that belongs to the same group as a constituent element of the oxide semiconductor is used for the insulating film. For example, it is effective to form an insulating film with the use of a material containing aluminum oxide. Aluminum oxide does not easily transmit water. Thus, it is preferable to use the material including aluminum oxide in order to prevent water from entering the oxide semiconductor layer.

The insulating film which is in contact with the oxide semiconductor layer 716 preferably contains oxygen in a proportion higher than the stoichiometric proportion by heat treatment in an oxygen atmosphere or oxygen doping. Oxygen doping is addition of oxygen to a bulk. Note that the term "bulk" is used in order to clarify that oxygen is added not only to a surface of a thin film but also to the inside of the thin film. The term "oxygen doping" also means "oxygen plasma doping" in which oxygen which is made to be plasma is added to a bulk. The oxygen doping may be performed by ion implantation or ion doping.

For example, in the case where the insulating film which is in contact with the oxide semiconductor layer 716 is formed using gallium oxide, the composition of gallium oxide can be $Ga_2O_X$ ($X=3+\alpha$, $0<\alpha<1$) by heat treatment in an oxygen atmosphere or oxygen doping.

In the case where the insulating film which is in contact with the oxide semiconductor layer 716 is formed using aluminum oxide, the composition of aluminum oxide can be $Al_2O_X$ ($X=3+\alpha$, $0<\alpha<1$) by heat treatment in an oxygen atmosphere or oxygen doping.

In the case where the insulating film which is in contact with the oxide semiconductor layer 716 is formed using gallium aluminum oxide (aluminum gallium oxide), the composition of gallium aluminum oxide (aluminum gallium oxide) can be $Ga_XAl_{2-X}O_{3+\alpha}$ ($0<X<2$, $0<\alpha<1$) by heat treatment in an oxygen atmosphere or oxygen doping.

By oxygen doping, an insulating film including a region where the proportion of oxygen is higher than the stoichiometric proportion can be formed. When the insulating film including such a region is in contact with the oxide semiconductor layer, oxygen that exists excessively in the insulating film is supplied to the oxide semiconductor layer, and oxygen deficiency in the oxide semiconductor layer or at the interface between the oxide semiconductor layer and the insulating film is reduced. Thus, the oxide semiconductor layer can be an intrinsic or substantially intrinsic oxide semiconductor.

The insulating film including a region where the proportion of oxygen is higher than the stoichiometric proportion may be applied to either the insulating film placed on an upper side of the oxide semiconductor layer or the insulating film placed on a lower side of the oxide semiconductor layer of the insulating films which are in contact with the oxide semiconductor layer 716; however, it is preferable to apply such an insulating film to both the insulating films. The above effect can be enhanced with a structure where the oxide semiconductor layer 716 is sandwiched between the insulating films each including a region where the proportion of oxygen is higher than the stoichiometric proportion, which are used as the insulating films in contact with the oxide semiconductor layer 716 and positioned on the upper side and the lower side of the oxide semiconductor layer 716.

The insulating films on the upper side and the lower side of the oxide semiconductor layer 716 may contain the same constituent element or different constituent elements. For example, the insulating films on the upper side and the lower side may be both formed using gallium oxide whose composition is $Ga_2O_X$ ($X=3+\alpha$, $0<\alpha<1$). Alternatively, one of the insulating films on the upper side and the lower side may be formed using $Ga_2O_X$ ($X=3+\alpha$, $0<\alpha<1$) and the other may be formed using aluminum oxide whose composition is $Al_2O_X$ ($X=3+\alpha$, $0<\alpha<1$).

The insulating film which is in contact with the oxide semiconductor layer 716 may be formed by a stack of insulating films each including a region where the proportion of oxygen is higher than the stoichiometric proportion. For example, the insulating film on the upper side of the oxide semiconductor layer 716 may be formed as follows: gallium oxide whose composition is $Ga_2O_X$ ($X=3+\alpha$, $0<\alpha<1$) is formed and gallium aluminum oxide (aluminum gallium oxide) whose composition is $Ga_XAl_{2-X}O_{3+\alpha}$ ($0<X<2$, $0<\alpha<1$) may be formed thereover. Note that the insulating film on the lower side of the oxide semiconductor layer 716 may be formed by a stack of insulating films each including a region where the proportion of oxygen is higher than the stoichiometric proportion. Alternatively, both the insulating films on the upper side and the lower side of the oxide semiconductor layer 716 may be formed by a stack of insulating films each including a region where the proportion of oxygen is higher than the stoichiometric proportion.

Figure 6D:
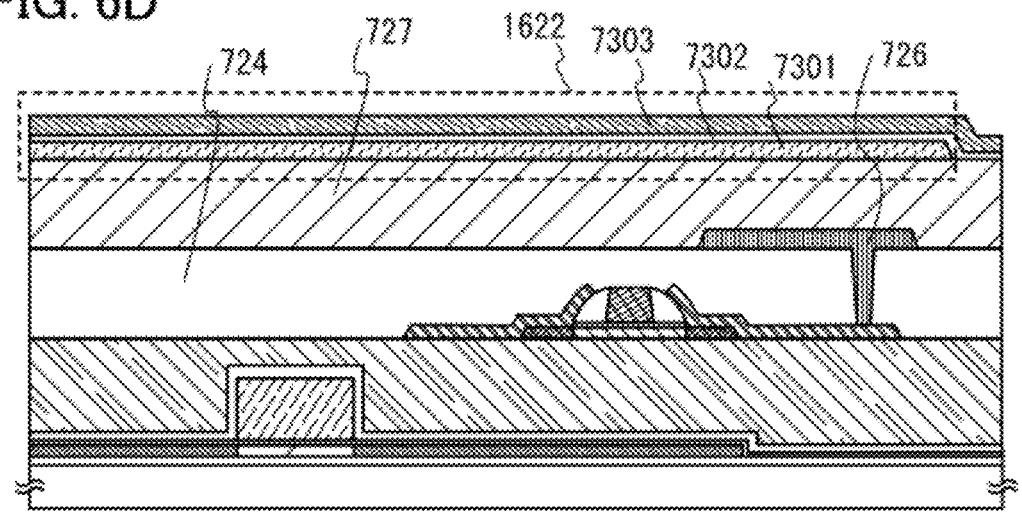

Next, as illustrated in FIG. 6D, the insulating film 724 is formed. The insulating film 724 can be formed by PVD, CVD, or the like. The insulating film 724 can be formed using a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is lowered, parasitic capacitance generated between wirings or electrodes can be reduced, which results in higher speed operation. Although the insulating film 724 has a single-layer structure in this embodiment, one embodiment of the present invention is not limited to this structure. The insulating film 724 may have a layered structure of two or more layers.

Next, an opening is formed in the insulating film 724, so that part of the conductive layer 720 is exposed. After that, a wiring 726 which is in contact with the conductive layer 720 through the opening is formed over the insulating film 724.

A conductive film is formed by PVD or CVD and then is etched so that the wiring 726 is formed. As the material of the conductive film, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used.

Specifically, for example, it is possible to employ a method in which a thin titanium film is formed in a region including the opening in the insulating film 724 by PVD and a thin titanium film (with a thickness of approximately 5 nm)

is formed by PVD, and then an aluminum film is formed to be embedded in the opening. Here, the titanium film formed by PVD has a function of reducing an oxide film (e.g., a native oxide film) formed on a surface over which the titanium film is formed, to decrease the contact resistance with the lower electrode or the like (here, the conductive layer 720). In addition, hillocks of the aluminum film can be prevented. A copper film may be formed by a plating method after a barrier film of titanium, titanium nitride, or the like is formed.

Next, the insulating film 727 is formed to cover the wiring 726. Further, a conductive film is formed over the insulating film 727 and is etched so that a conductive layer 7301 is formed. Then, an insulating film 7302 is formed to cover the conductive layer 7301, and a conductive film 7303 is formed over the insulating film 7302. Thus, the capacitor 1622 can be formed. One of the pair of electrodes of the capacitor 1622 corresponds to the conductive layer 7301. The other of the pair of electrodes of the capacitor 1622 corresponds to the conductive film 7303. A dielectric layer of the capacitor 1622 corresponds to the insulating film 7302. Here, the materials of the insulating film 727, the conductive layer 7301, the insulating film 7302, and the conductive film 7303 can be similar to the materials of other insulating films and other conductive layers.

Through the series of steps, the comparator 100 can be formed.

This embodiment can be combined with any of the other embodiments as appropriate.

Embodiment 5

In this embodiment, the field-effect mobility of a transistor whose channel is formed in an oxide semiconductor layer is described.

The actually measured field-effect mobility of an insulated gate transistor can be lower than its original mobility because of a variety of reasons; this phenomenon occurs not only in the case of using an oxide semiconductor. One of factors that reduce the mobility is a defect in a semiconductor or a defect at an interface between the semiconductor and an insulating film. When a Levinson model is used, the field-effect mobility on the assumption that no defect exists in the semiconductor can be calculated theoretically.

Assuming that the original mobility and measured field-effect mobility of a semiconductor are $\mu_0$ and $\mu$, respectively, and a potential barrier (e.g., a grain boundary) exists in the semiconductor, the measured field-effect mobility can be expressed as the following equation.

$$\mu = \mu_0 \exp\left(-\frac{E}{kT}\right) \quad \text{[Equation 1]}$$

Here, E, k, and T represent the height of the potential barrier, the Boltzmann constant, and the absolute temperature, respectively. When the potential barrier is assumed to be attributed to a defect, the height E of the potential barrier is expressed as the following equation according to the Levinson model.

$$E = \frac{e^2 N^2}{8\varepsilon n} = \frac{e^3 N^2 t}{8\varepsilon C_{ox} V_g} \quad \text{[Equation 2]}$$

Here, e, N, $\varepsilon$, n, $C_{ox}$, $V_g$, and t represent elementary electric charge, average defect density per unit area in a channel, the permittivity of the semiconductor, the carrier plane density of the channel, capacitance per unit area, gate voltage, and the thickness of the channel, respectively. Note that in the case where the thickness of the semiconductor layer is 30 nm or less, the thickness of the channel can be equal to the thickness of the semiconductor layer.

Drain current $I_d$ in a linear region is expressed as the following equation.

$$I_d = \frac{W \mu V_g V_d C_{ox}}{L} \exp\left(-\frac{E}{kT}\right) \quad \text{[Equation 3]}$$

Here, L and W represent channel length and channel width, respectively, and L and W are each 10 μm. In addition, $V_d$ represents drain voltage. When both sides of the above equation are divided by $V_g$ and then logarithms of both sides are taken, the following equation is obtained.

$$\ln\left(\frac{I_d}{V_g}\right) = \quad \text{[Equation 4]}$$
$$\ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\varepsilon C_{ox} V_g}$$

The right side of Equation 5 is a function of $V_g$. From the equation, it is clear that the defect density N can be obtained from the slope of a line in which $\ln(I_d/V_g)$ is the ordinate and $1/V_g$ is the abscissa. That is, the defect density can be evaluated from the $I_d$-$V_g$ characteristics of the transistor.

Figure 13:
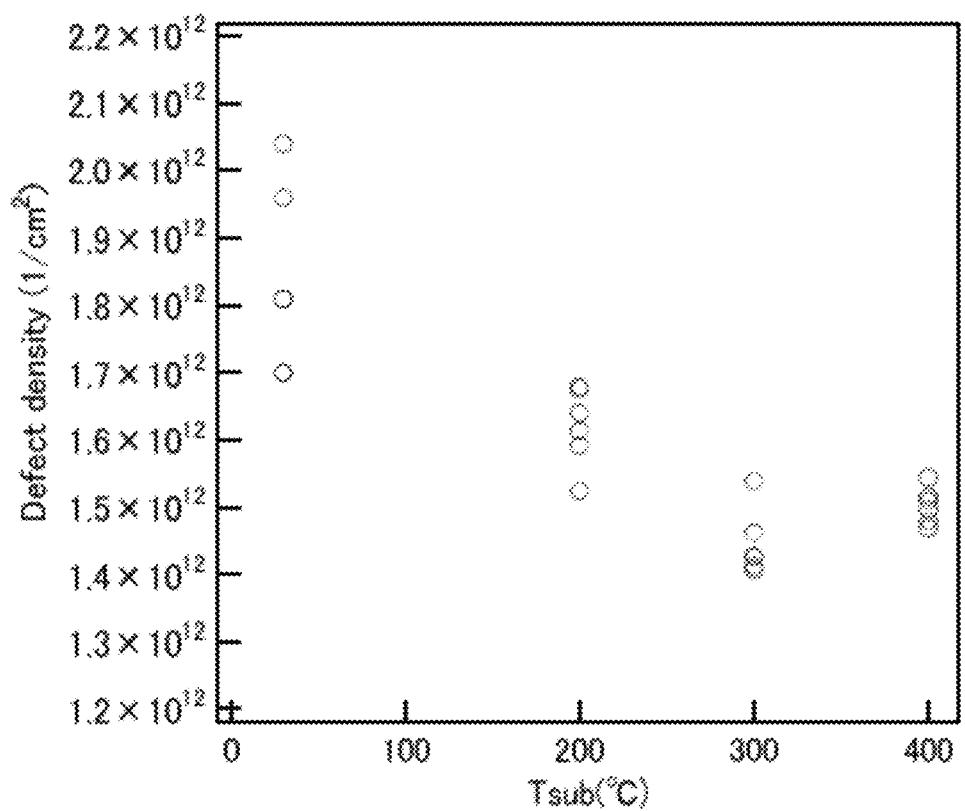
FIG. 13 is a graph showing a relationship between substrate heating temperature and defect density during deposition of an oxide semiconductor film.

The defect density depends on the substrate temperature during deposition of an oxide semiconductor. FIG. 13 shows a relationship between the substrate heating temperature and the defect density. An oxide semiconductor having a ratio of indium (In):gallium (Ga):zinc (Zn)=1:1:1 is used as the oxide semiconductor. FIG. 13 shows that the defect density of the oxide semiconductor deposited at a high substrate heating temperature is lower than that of the oxide semiconductor deposited at room temperature.

On the basis of the thus obtained defect density or the like, $\mu_0$ can be calculated to be 80 cm²N·s from Equations 1 and 2. An oxide semiconductor having many defects (N is approximately $1.5 \times 10^{12}$/cm²) has a mobility of approximately 10 cm²N·s. However, the mobility of an ideal oxide semiconductor that has no defect in the semiconductor and at an interface between the semiconductor and an insulating film is 80 cm²N·s.

Note that even when no defect exists in a semiconductor, scattering at an interface between a channel and a gate insulator affects the transport property of the transistor. In other words, mobility $\mu_1$ at a position that is distance x away from the interface between the channel and the gate insulator can be expressed as the following equation.

$$\frac{1}{\mu_1} = \frac{1}{\mu_0} + \frac{D}{B} \exp\left(-\frac{x}{l}\right) \quad \text{[Equation 5]}$$

Here, D represents an electric field in a gate direction, and B and l are constants. From actual measurement results, B and l can be taken. According to the measurement results, B is $2.38 \times 10^7$ cm/s and l is 10 nm (the depth to which interface scattering reaches). As D becomes higher (i.e., as the gate voltage becomes higher), the second term of Equation 5 increases and thus the mobility $\mu_1$ decreases.

Figure 14:
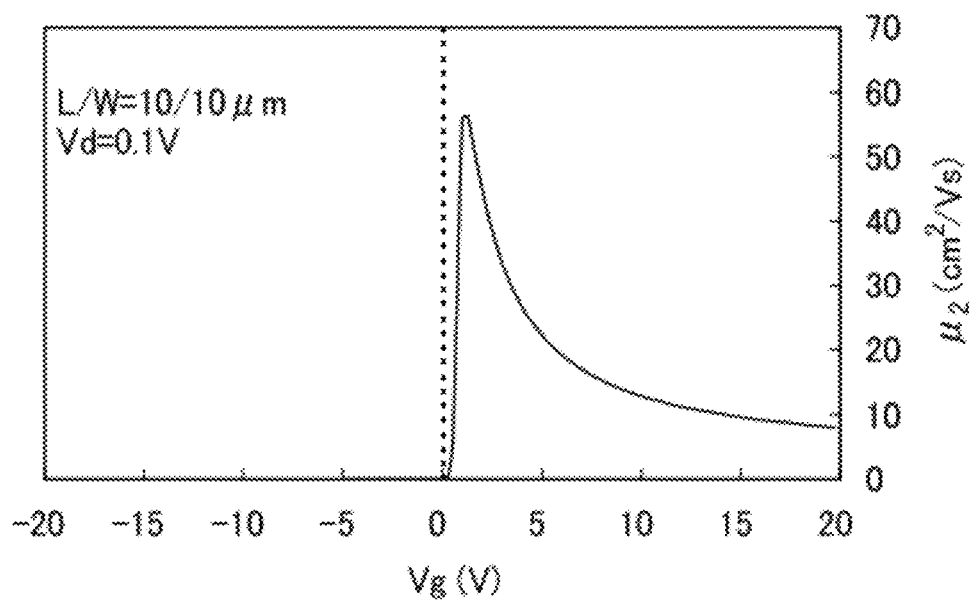
FIG. 14 is a graph showing the mobility of a transistor including an ideal oxide semiconductor layer used for a channel.

FIG. 14 shows the calculation results of mobility $\mu_2$ of a transistor whose channel includes an ideal oxide semiconductor having no defect in the semiconductor. For the calculation, device simulation software Sentaurus Device manufactured by Synopsys, Inc. was used, and the bandgap, electron affinity, relative permittivity, and thickness of the oxide semiconductor were assumed to be 3.15 eV, 4.6 eV, 15, and 30 nm, respectively. Further, the work functions of a gate, a source, and a drain were assumed to be 5.5 eV, 4.6 eV, and 4.6 eV, respectively. The thickness of and relative permittivity of a gate insulator were assumed to be 30 nm and 4.1, respectively. The channel length and the channel width were each assumed to be 10 μam, and the drain voltage $V_d$ was assumed to be 0.1 V.

As shown in FIG. 14, the mobility has a peak of 50 cm$^2$N·s or more at a gate voltage of slightly over 1 V and decreases as the gate voltage becomes higher because the influence of interface scattering increases.

This embodiment can be combined with any of the other embodiments as appropriate.

Example 1

With the use of a semiconductor device including a chopper comparator according to one embodiment of the present invention, a small highly reliable electronic device can be provided.

The semiconductor device according to one embodiment of the present invention can be used for display devices, personal computers, or image reproducing devices provided with recording media (typically, devices which reproduce the content of recording media such as digital versatile discs (DVDs) and have displays for displaying the reproduced images). Further, as an electronic device which can include the semiconductor device including a chopper comparator according to one embodiment of the present invention, cellular phones, game machines (including portable game machines), personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multi-function printers, automated teller machines (ATM), vending machines, and the like can be given.

The case is described in which the semiconductor device including a chopper comparator according to one embodiment of the present invention is applied to a portable electronic device such as a cellular phone, a smartphone, or an e-book reader.

Figure 7:
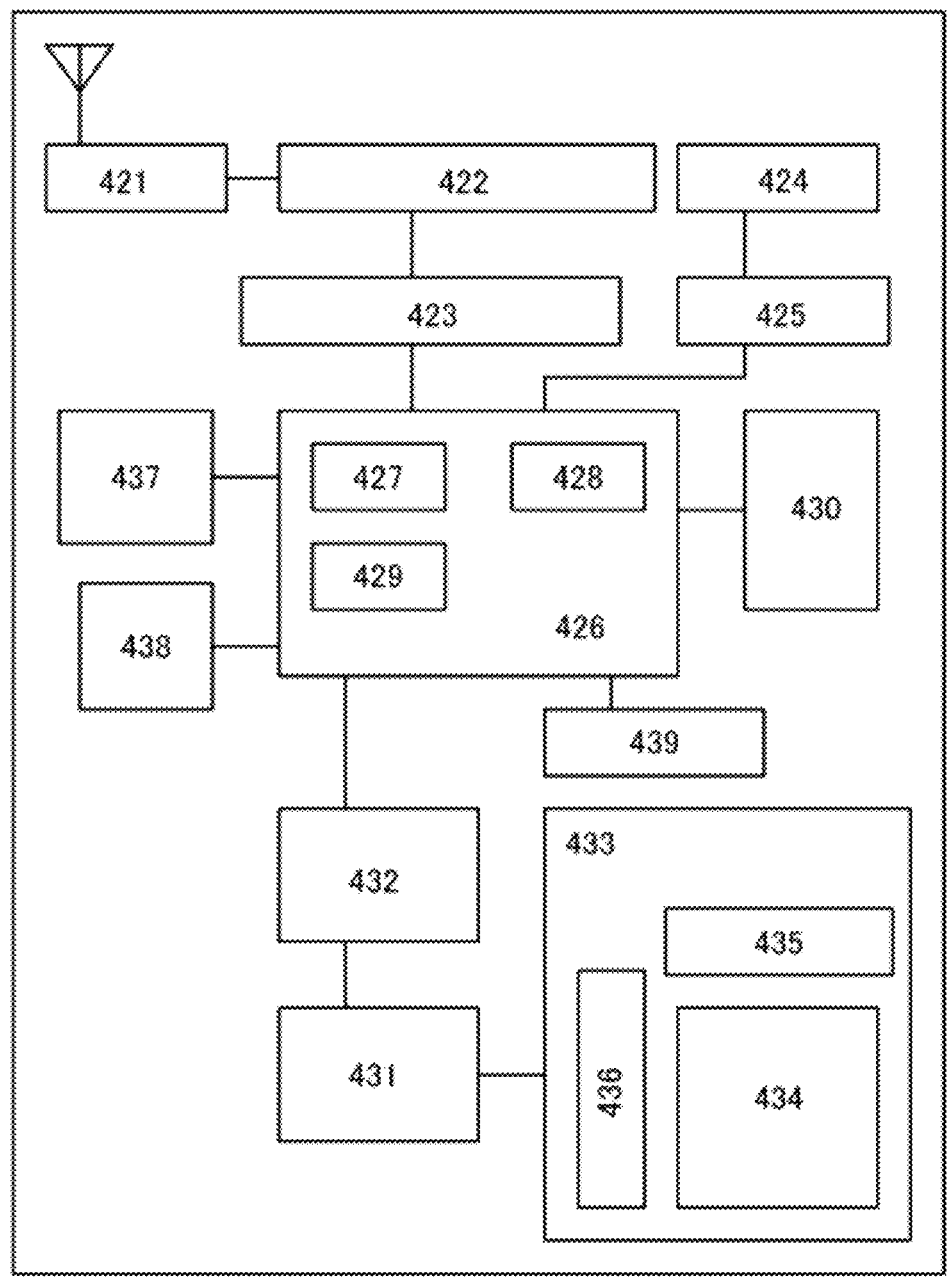
FIG. 7 is a block diagram of a portable electronic device.

FIG. 7 is a block diagram of a portable electronic device. The portable electronic device illustrated in FIG. 7 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a DSP 428, and an interface 429. For example, when a semiconductor device including the chopper comparator in the above embodiment is used for any or all of the RF circuit 421, the analog baseband circuit 422, the digital baseband circuit 423, the power supply circuit 425, the application processor 426, the flash memory 430, the display controller 431, the memory circuit 432, the display 433, the touch sensor 439, and the audio circuit 437, a small highly reliable electronic device can be obtained.

Figure 8:
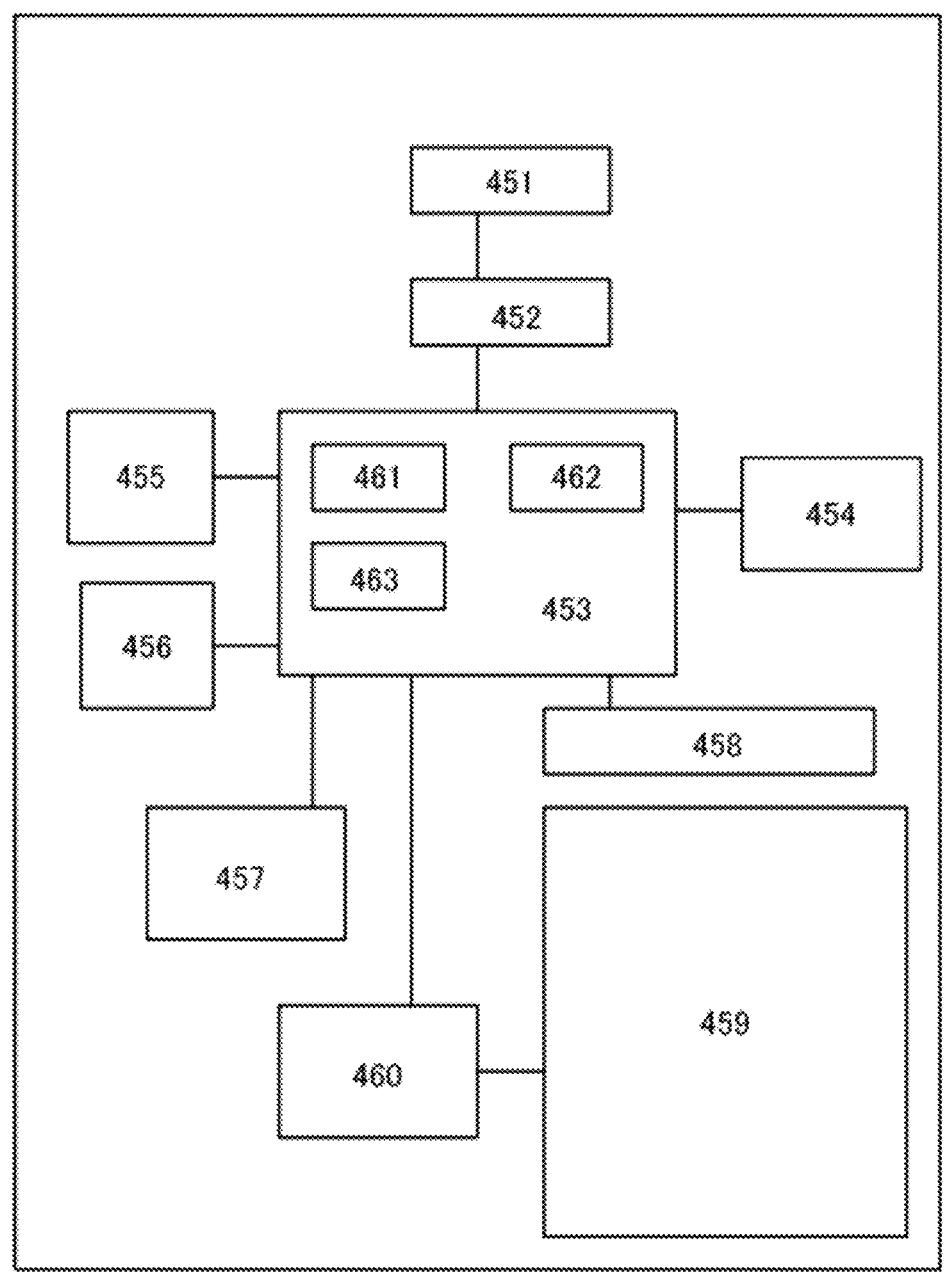
FIG. 8 is a block diagram of an e-book reader.
Figure 9:
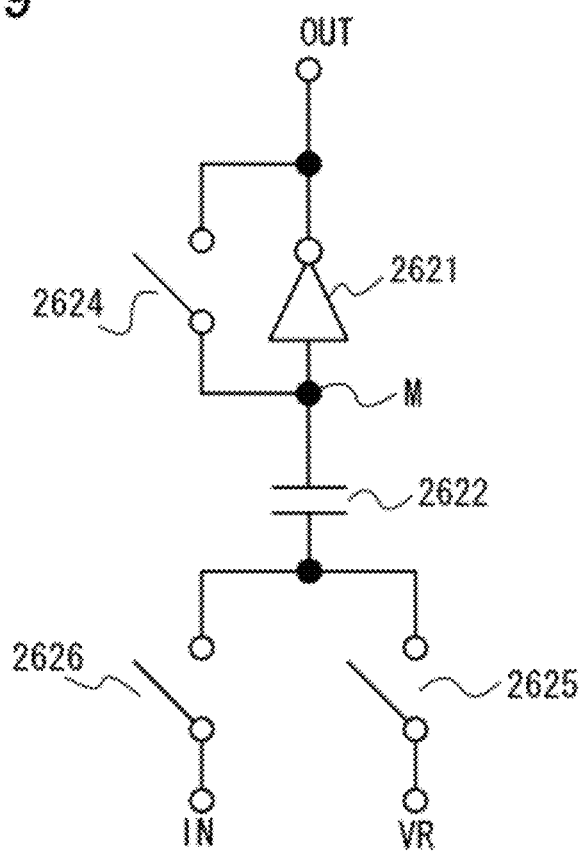
FIG. 9 is a circuit diagram illustrating the structure of a conventional chopper comparator.

FIG. 8 is a block diagram of an e-book reader. The e-book reader includes a battery 451, a power supply circuit 452, a microprocessor 453, a flash memory 454, an audio circuit 455, a keyboard 456, a memory circuit 457, a touch panel 458, a display 459, and a display controller 460. The microprocessor 453 includes a CPU 461, a DSP 462, and an interface 463. For example, when a semiconductor device including the chopper comparator in the above embodiment is used for any or all of the power supply circuit 452, the CPU 461, the DSP 462, the interface 463, the flash memory 454, the audio circuit 455, the memory circuit 457, the touch panel 458, the display 459, and the display controller 460, a small highly reliable e-book reader can be obtained.

This example can be combined with any of the above embodiments as appropriate.

This application is based on Japanese Patent Application serial No. 2011-100957 filed with Japan Patent Office on Apr. 28, 2011, the entire contents of which are hereby incorporated by reference.

What is claimed is:

1. A comparator comprising:
   an inverter;
   a capacitor;
   a first switch;
   a second switch; and
   a third switch,
   wherein an input terminal and an output terminal of the inverter are electrically connected to each other through the first switch,
   wherein the first switch and the input terminal of the inverter are electrically connected to one of a pair of electrodes of the capacitor,
   wherein the second switch and the third switch are electrically connected to the other of the pair of electrodes of the capacitor,
   wherein the first switch comprises a first transistor whose channel is formed in an oxide semiconductor layer, and
   wherein at least one of the second switch, the third switch, and the inverter comprises a second transistor whose channel is formed in a silicon layer or a silicon substrate.

2. The comparator according to claim 1, wherein the first transistor overlaps with the second transistor.

3. The comparator according to claim 1, wherein the oxide semiconductor layer comprises at least one of indium and zinc.

4. The comparator according to claim 1, wherein the inverter is a clocked inverter configured to invert a signal input to an input terminal of the clocked inverter and outputs the inverted signal from an output terminal of the clocked inverter, in synchronization with a clock signal.

5. The comparator according to claim 1,
   wherein a reference potential is applied to the other of the pair of electrodes of the capacitor when the second switch is in an on state,
   wherein a signal potential is applied to the other of the pair of electrodes of the capacitor when the third switch is in an on state, and
   wherein an output signal is output from the output terminal of the inverter.

6. The comparator according to claim 5,
   wherein the second switch is electrically connected to a first terminal to which the reference potential is input, and wherein the third switch is electrically connected to a second terminal to which the signal potential is input.

7. A semiconductor device comprising the comparator according to claim 1.

8. A comparator comprising:
an inverter;
a capacitor;
a first switch;
a second switch; and
a third switch,
wherein an input terminal and an output terminal of the inverter are electrically connected to each other through the first switch,
wherein the first switch and the input terminal of the inverter are electrically connected to one of a pair of electrodes of the capacitor,
wherein the second switch and the third switch are electrically connected to the other of the pair of electrodes of the capacitor,
wherein the first switch comprises a plurality of transistors electrically connected in parallel to each other,
wherein each of channels of the plurality of transistors is formed in an oxide semiconductor layer, and
wherein at least one of the second switch, the third switch, and the inverter comprises a second transistor whose channel is formed in a silicon layer or a silicon substrate.

9. The comparator according to claim 8, wherein the plurality of transistors are provided to overlap with each other.

10. The comparator according to claim 8, wherein the first transistor overlaps with the second transistor.

11. The comparator according to claim 8, wherein the oxide semiconductor layer comprises at least one of indium and zinc.

12. The comparator according to claim 8, wherein the inverter is a clocked inverter configured to invert a signal input to an input terminal of the clocked inverter and outputs the inverted signal from an output terminal of the clocked inverter, in synchronization with a clock signal.

13. The comparator according to claim 8,
wherein a reference potential is applied to the other of the pair of electrodes of the capacitor when the second switch is in an on state,
wherein a signal potential is applied to the other of the pair of electrodes of the capacitor when the third switch is in an on state, and
wherein an output signal is output from the output terminal of the inverter.

14. The comparator according to claim 13,
wherein the second switch is electrically connected to a first terminal to which the reference potential is input, and
wherein the third switch is electrically connected to a second terminal to which the signal potential is input.

15. A semiconductor device comprising the comparator according to claim 8.

16. A comparator comprising:
an inverter;
a capacitor;
a first switch;
a second switch; and
a third switch,
wherein an input terminal and an output terminal of the inverter are electrically connected to each other through the first switch,
wherein the first switch and the input terminal of the inverter are electrically connected to one of a pair of electrodes of the capacitor,
wherein the second switch and the third switch are electrically connected to the other of the pair of electrodes of the capacitor,
wherein the first switch comprises a plurality of transistors electrically connected in series with each other,
wherein each of channels of the plurality of transistors is formed in an oxide semiconductor layer, and
wherein at least one of the second switch, the third switch, and the inverter comprises a second transistor whose channel is formed in a silicon layer or a silicon substrate.

17. The comparator according to claim 16, wherein the plurality of transistors are provided to overlap with each other.

18. The comparator according to claim 16, wherein the first transistor overlaps with the second transistor.

19. The comparator according to claim 16, wherein the oxide semiconductor layer comprises at least one of indium and zinc.

20. The comparator according to claim 16, wherein the inverter is a clocked inverter configured to invert a signal input to an input terminal of the clocked inverter and outputs the inverted signal from an output terminal of the clocked inverter, in synchronization with a clock signal.

21. The comparator according to claim 16,
wherein a reference potential is applied to the other of the pair of electrodes of the capacitor when the second switch is in an on state,
wherein a signal potential is applied to the other of the pair of electrodes of the capacitor when the third switch is in an on state, and
wherein an output signal is output from the output terminal of the inverter.

22. The comparator according to claim 21,
wherein the second switch is electrically connected to a first terminal to which the reference potential is input, and
wherein the third switch is electrically connected to a second terminal to which the signal potential is input.

23. A semiconductor device comprising the comparator according to claim 16.

* * * * *